US009130187B2

(12) United States Patent
Nishiyama et al.

(10) Patent No.: US 9,130,187 B2
(45) Date of Patent: *Sep. 8, 2015

(54) ORGANIC EL ELEMENT, DISPLAY DEVICE, AND LIGHT-EMITTING DEVICE

(71) Applicant: JOLED INC., Tokyo (JP)

(72) Inventors: Seiji Nishiyama, Osaka (JP); Satoru Ohuchi, Osaka (JP); Shinya Fujimura, Osaka (JP); Hirofumi Fujita, Osaka (JP)

(73) Assignee: JOLED INC., Tokyo (JP)

( * ) Notice: Subject to any disclaimer, the term of this patent is extended or adjusted under 35 U.S.C. 154(b) by 4 days.

This patent is subject to a terminal disclaimer.

(21) Appl. No.: 13/736,285

(22) Filed: Jan. 8, 2013

(65) Prior Publication Data

US 2013/0119366 A1 May 16, 2013

Related U.S. Application Data

(63) Continuation of application No. PCT/JP2010/004959, filed on Aug. 6, 2010.

(51) Int. Cl.
*H01L 29/08* (2006.01)
*H01L 51/50* (2006.01)
(Continued)

(52) U.S. Cl.
CPC ........ *H01L 51/5088* (2013.01); *H01L 27/3246* (2013.01); *H01L 51/5218* (2013.01); *H01L 51/5271* (2013.01); *H01L 51/56* (2013.01); *H01L 2251/5361* (2013.01)

(58) Field of Classification Search
CPC ............... H01L 2251/5361; H01L 27/3246; H01L 51/5088; H01L 51/5218; H01L 51/5271; H01L 51/56; H01L 2251/5369; H01L 51/5209; H05B 33/22

USPC .................. 257/40, 13; 313/504, 506; 445/24
See application file for complete search history.

(56) References Cited

U.S. PATENT DOCUMENTS 5,294,869 A 3/1994 Tang et al.
5,443,922 A 8/1995 Nishizaki et al.
(Continued)

FOREIGN PATENT DOCUMENTS

CN 1703122 11/2005
CN 101243553 8/2008
(Continued)

OTHER PUBLICATIONS

United States Restriction Requirement in U.S. Appl. No. 13/740,353, dated Sep. 22, 2014.
(Continued)

*Primary Examiner* — Mohammed Shamsuzzaman
(74) *Attorney, Agent, or Firm* — Greenblum & Bernstein, P.L.C.

(57) ABSTRACT

The present invention aims to provide organic EL elements operating at low voltage to emit light at high intensity. For this aim, each EL element includes an anode, a cathode, a functional layer disposed between the anode and the cathode and including a light-emitting layer composed of organic material, a hole injection layer disposed between the anode and the functional layer, and a bank defining the light-emitting layer. The hole injection layer contains tungsten oxide and exhibits: by UPS measurement, a UPS spectrum having a protrusion appearing near a Fermi surface and within a region corresponding to a binding energy range lower than the top of a valence band; and by XPS measurement, that the tungsten oxide in the hole injection layer satisfies a condition that a ratio in number density of atoms other than tungsten atoms and oxygen atoms to the tungsten atoms is equal to 0.83 or smaller.

20 Claims, 24 Drawing Sheets

(51) Int. Cl.
    *H01L 27/32* (2006.01)
    *H01L 51/52* (2006.01)
    *H01L 51/56* (2006.01)

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 7,785,718 B2 | 8/2010 | Yatsunami et al. |
| 8,829,510 B2 | 9/2014 | Komatsu et al. |
| 8,884,276 B2 | 11/2014 | Komatsu et al. |
| 8,884,281 B2 | 11/2014 | Ohuchi et al. |
| 2002/0051894 A1 | 5/2002 | Yoshikawa |
| 2002/0158835 A1 | 10/2002 | Kobayashi et al. |
| 2003/0137242 A1* | 7/2003 | Seki ................... 313/506 |
| 2004/0075385 A1 | 4/2004 | Tao |
| 2004/0178414 A1 | 9/2004 | Frey et al. |
| 2005/0064633 A1 | 3/2005 | Mikoshiba |
| 2005/0093432 A1 | 5/2005 | Yamazaki et al. |
| 2005/0093434 A1 | 5/2005 | Suh et al. |
| 2005/0170208 A1 | 8/2005 | Yatsunami et al. |
| 2005/0208206 A1 | 9/2005 | Yoshikawa |
| 2005/0266763 A1* | 12/2005 | Kimura et al. ............... 445/24 |
| 2006/0008931 A1 | 1/2006 | Lee et al. |
| 2006/0139342 A1 | 6/2006 | Yu |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0034864 A1 | 2/2007 | Liu |
| 2007/0099396 A1 | 5/2007 | Hirai et al. |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0100209 A1* | 5/2008 | Ito ................... 313/504 |
| 2008/0150422 A1 | 6/2008 | Ohara |
| 2008/0231179 A1 | 9/2008 | Abe et al. |
| 2008/0312437 A1* | 12/2008 | Inoue et al. ............... 544/225 |
| 2009/0008643 A1 | 1/2009 | Yamazaki et al. |
| 2009/0058268 A1 | 3/2009 | Yoshida et al. |
| 2009/0096364 A1 | 4/2009 | Fujii et al. |
| 2009/0115318 A1* | 5/2009 | Gregory et al. ............... 313/504 |
| 2009/0160325 A1 | 6/2009 | Yatsunami et al. |
| 2009/0200917 A1 | 8/2009 | Yamagata et al. |
| 2009/0206422 A1 | 8/2009 | Illing et al. |
| 2009/0224664 A1 | 9/2009 | Yoshida et al. |
| 2009/0243478 A1 | 10/2009 | Shoda et al. |
| 2009/0250685 A1* | 10/2009 | Moon ............... 257/13 |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2009/0284146 A1 | 11/2009 | Yoshida et al. |
| 2009/0315027 A1 | 12/2009 | Kidu et al. |
| 2010/0084672 A1 | 4/2010 | Ueno et al. |
| 2010/0102310 A1 | 4/2010 | Komatsu et al. |
| 2010/0181554 A1 | 7/2010 | Yoshida et al. |
| 2010/0181559 A1* | 7/2010 | Nakatani et al. ............... 257/40 |
| 2010/0188376 A1 | 7/2010 | Sagawa et al. |
| 2010/0213827 A1 | 8/2010 | Yoshida et al. |
| 2010/0252857 A1 | 10/2010 | Nakatani et al. |
| 2010/0258833 A1 | 10/2010 | Okumoto et al. |
| 2010/0302221 A1 | 12/2010 | Okumoto |
| 2011/0018007 A1 | 1/2011 | Kasahara et al. |
| 2011/0037065 A1* | 2/2011 | Ueno et al. ............... 257/40 |
| 2011/0037068 A1 | 2/2011 | Yamazaki et al. |
| 2011/0042703 A1 | 2/2011 | Okumoto et al. |
| 2011/0140091 A1* | 6/2011 | Friend et al. ............... 257/40 |
| 2011/0140596 A1 | 6/2011 | Yoshida et al. |
| 2011/0180821 A1 | 7/2011 | Matsushima |
| 2011/0193107 A1 | 8/2011 | Takeuchi et al. |
| 2011/0198623 A1 | 8/2011 | Matsushima |
| 2011/0198624 A1 | 8/2011 | Matsushima |
| 2011/0204410 A1 | 8/2011 | Yada |
| 2012/0061656 A1 | 3/2012 | Ohuchi et al. |
| 2012/0132935 A1 | 5/2012 | Isobe et al. |
| 2012/0178191 A1 | 7/2012 | Sakanoue et al. |
| 2013/0126841 A1* | 5/2013 | Nishiyama et al. ............. 257/40 |
| 2013/0126847 A1* | 5/2013 | Harada et al. ............... 257/40 |
| 2013/0126848 A1* | 5/2013 | Harada et al. ............... 257/40 |
| 2013/0134403 A1* | 5/2013 | Harada et al. ............... 257/40 |
| 2013/0140543 A1* | 6/2013 | Harada et al. ............... 257/40 |

FOREIGN PATENT DOCUMENTS

| | | |
|---|---|---|
| CN | 101689559 | 3/2010 |
| DE | 102005007540 | 8/2006 |
| EP | 2175504 | 4/2010 |
| EP | 2270896 | 1/2011 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-220656 | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-218250 | 9/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-009746 | 1/2010 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |

(56) References Cited

FOREIGN PATENT DOCUMENTS

| | | |
|---|---|---|
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| TW | 200917894 | 4/2009 |
| WO | 2007/037358 | 4/2007 |
| WO | 2008/120714 A1 | 10/2008 |
| WO | 2008/149498 A1 | 12/2008 |
| WO | 2008/149499 A1 | 12/2008 |
| WO | 2009/107323 | 9/2009 |
| WO | 2009/133903 | 11/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

United States Notice of Allowance in U.S. Appl. No. 13/746,481, dated Sep. 24, 2014.
United States Notice of Allowance in U.S. Appl. No. 13/742,575, dated Sep. 30, 2014.
United States Office Action in U.S. Appl. No. 13/205,773, dated Aug. 16, 2013.
United States Advisory Action in U.S. Appl. No. 13/205,773, dated Jan. 15, 2014.
United States Office Action in U.S. Appl. No. 13/205,773, dated Feb. 28, 2014.
Tungsten Oxide, McGraw-Hill Dictionary of Scientific and Technical Terms, McGraw-Hill Book Company, Fourth Edition, p. 1979, left column, date stamped Feb. 28, 1989.
U.S. Appl. No. 14/000,977 to Satoru Ohuchi et al., filed Aug. 22, 2013.
United States Office Action in U.S. Appl. No. 13/205,773, dated Jan. 10, 2013.
Extended European Search Report (EESR) in European Patent Application No. 10741076.3, dated Feb. 25, 2013.
Ramana et al., "Electron microscopy investigation of structural transformation in tungsten oxide (WO3) thin films", Physica Status Solidi (a) 202, No. 10, pp. R108-R110 (Jul. 6, 2005).
Horsley et al., "Structure of Surface Tungsten Oxide Species in the WO3/AL2O3 Supported Oxide System from X-Ray Absorption Near-edge Spectroscopy and Raman Spectroscopy", Journal of Physical Chemistry, 91, pp. 4014-4020 (1987).
United States Office Action in U.S. Appl. No. 13/746,481, dated Apr. 29, 2014.
United States Office Action in U.S. Appl. No. 13/740,348, dated Apr. 29, 2014.
United States Office Action in U.S. Appl. No. 13/742,575, dated Jul. 17, 2014.
United States Office Action in U.S. Appl. No. 13/742,575, dated Mar. 14, 2014.
Meyer et al., "Charge generation layers comprising transition metal-oxide/organic interfaces: Electronic structure and charge generation mechanism", Applied Physics Letters, 96, 193302, pp. 1-3 (May 2010).
Elam et al., "Nucleation and growth during tungsten atomic layer deposition on $SiO_2$ surfaces", Thin Solid Films, 386, pp. 41-52 (2001).
United States Office Action in U.S. Appl. No. 13/746,474, dated Apr. 11, 2014.
United States Office Action in U.S. Appl. No. 13/205,773, dated Mar. 6, 2013.
United States Office Action in U.S. Appl. No. 13/360,984, dated Jun. 27, 2013.
United States Office Action in U.S. Appl. No. 13/205,773, dated Jul. 17, 2014.
United States Office Action in U.S. Appl. No. 13/739,363, dated Aug. 1, 2014.
United States Office Action in U.S. Appl. No. 13/746,474, dated Aug. 6, 2014.
China Office Action from State Intellectual Property Office (SIPO) in Chinese Patent Application No. 201080004030.X, dated Aug. 26, 2013, together with a partial English language translation.
China Office Action from State Intellectual Property Office (SIPO) in Chinese Patent Application No. 201080025874.2, dated Jan. 16, 2014, together with a partial English language translation.
Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
U.S. Appl. No. 13/205,773 to Seiji Nishiyama, filed Aug. 9, 2011.
U.S. Appl. No. 13/360,984 to Satoru Ohuchi et al., filed Jan. 30, 2012.
U.S. Appl. No. 13/739,363 to Seiji Nishiyama et al., filed Jan. 11, 2013.
U.S. Appl. No. 13/740,348 to Seiji Nishiyama et al., filed Jan. 14, 2013.
U.S. Appl. No. 13/740,353 to Seiji Nishiyama, filed Jan. 14, 2013.
U.S. Appl. No. 13/739,290 to Seiji Nishiyama, filed Jan. 11, 2013.
U.S. Appl. No. 13/746,481 to Seiji Nishiyama, filed Jan. 22, 2013.
U.S. Appl. No. 13/742,575 to Kenji Harada et al., filed Jan. 16, 2013.
U.S. Appl. No. 13/746,474 to Kenji Harada et al., filed Jan. 22, 2013.

(56) References Cited

OTHER PUBLICATIONS

United States Office Action in U.S. Appl. No. 13/360,984, dated Mar. 1, 2013.
International Search Report in PCT/JP2010/000782, dated Apr. 6, 2010.
International Search Report in PCT/JP2010/004212, dated Aug. 3, 2010.
International Search Report in PCT/JP2010/004987, dated Sep. 7, 2010.
International Search Report in PCT/JP2010/004959, dated Nov. 9, 2010.
International Search Report in PCT/JP2010/004985, dated Nov. 16, 2010.
International Search Report in PCT/JP2010/004962, dated Sep. 7, 2010.
International Search Report in PCT/JP2010/004955, dated Sep. 7, 2010.
International Search Report in PCT/JP2010/004986, dated Aug. 31, 2010.
International Search Report in PCT/JP2010/004954, dated Sep. 7, 2010.
International Search Report in PCT/JP2010/004960, dated Nov. 9, 2010.
International Search Report in PCT/JP2011/006448, dated Feb. 21, 2012.
China Office Action from State Intellectual Property Office (SIPO) in Chinese Patent Application No. 201080068373.2, dated Feb. 25, 2015, together with a partial English language translation.
United States Notice of Allowance in U.S. Appl. No. 14/000,977, dated Nov. 21, 2014.
United States Notice of Allowance in U.S. Appl. No. 13/746,474, dated Dec. 16, 2014.
China Office Action from State Intellectual Property Office (SIPO) in Chinese Patent Application No. 201080068375.1, dated Jan. 26, 2015, together with a partial English language translation.
China Office Action from State Intellectual Property Office (SIPO) in Chinese Patent Application No. 201080068374.7, dated Feb. 4, 2015, together with a partial English language translation.

* cited by examiner

ORGANIC EL ELEMENT, DISPLAY DEVICE, AND LIGHT-EMITTING DEVICE

CROSS REFERENCE TO RELATED APPLICATION

This is a continuation application of PCT Application No. PCT/JP2010/004959 filed Aug. 6, 2010, designating the United States of America, the disclosure of which, including the specification, drawings and claims, is incorporated herein by reference in its entirety.

TECHNICAL FIELD

The present disclosure relates to an organic electric-field light-emitting element (hereinafter referred to as an "organic EL element"), which is an electric light-emitting element. The present disclosure also relates to a display apparatus and a light-emitting apparatus each having an organic EL element.

DESCRIPTION OF THE RELATED ART

In recent years, progress is being made in research and development of diverse functional elements which involve the use of an organic semiconductor. One typical example of a functional element is an organic EL element. An organic EL element is a current-driven light-emitting element, and commonly has a pair of electrodes, namely an anode and a cathode, and a functional layer layered between the pair of electrodes. The functional layer includes a light-emitting layer composed of an organic material. Upon application of voltage across the pair of electrodes, holes injected from the anode to the functional layer recombine with electrons injected from the cathode to the functional layer. The recombination causes the phenomenon of electroluminescence, which involves emission of light. Being self-luminescent, an organic EL element is highly visible. In addition, being completely solid, an organic EL element has excellent impact resistance. Owing to these advantages, more attention is being given to the applications of organic EL elements as a light-emitting element or a light source for various display apparatuses.

To cause an organic EL element to emit light at high intensity, efficient injection of carriers (i.e., holes and electrons) from the electrodes to the functional layer is important. Generally, the provision of injection layers between each of the electrodes and a functional layer is effective in facilitating efficient injection of carriers. This is because an injection layer serves to lower the energy barrier to be overcome in the injection of carriers. An injection layer disposed between a functional layer and the anode is a hole injection layer composed of an organic material, such as copper phthalocyanine or PEDOT (conductive polymer), or of a metal oxide, such as molybdenum oxide or tungsten oxide. An injection layer disposed between a functional layer and the cathode is an electron injection layer composed of an organic material, such as metal complex or oxadiazole, or of a metal, such as barium.

It has been reported that organic EL elements having a hole injection layer composed of a metal oxide, such as molybdenum oxide or tungsten oxide, exhibit improved hole injection efficiency and longevity (see Patent Literature 1 and Non-Patent Literature 1). It is further reported that the improvement achieved is relevant to the energy level resulting from structures similar to oxygen vacancies of metal oxide on the surface of the hole injection layer (see Non-Patent Literature 2).

CITATION LIST

Patent Literature

[Patent Literature 1]
Japanese Patent Application Publication No. 2005-203339

Non-Patent Literature

[Non-Patent Literature 1]
Jingze Li et al., Synthetic Metals 151, 141 (2005)
[Non-Patent Literature 2]
Kaname Kanai et al., Organic Electronics 11, 188 (2010)
[Non-Patent Literature 3]
J. B. Pedley et al., Journal of Physical and Chemical Reference Data 12, 967 (1983)
[Non-Patent Literature 4]
I. N. Yakovkin et al., Surface Science 601, 1481 (2007)

SUMMARY

In the manufacturing of an organic EL element, problems are presented by adsorbates, mainly carbon-containing adsorbates, derived from molecules of carbon dioxide, water, and organic material contained in the atmosphere or from molecules of impurities generated during the manufacturing steps. To be more specific, in a step of laminating the respective layers of an organic EL element, if a hole injection layer with adsorbates on its surface is topped with another layer, the adsorbates are embedded between the layers. The presence of adsorbates involves the risk of increasing the drive voltage of, and/or reducing the longevity of the resulting organic EL element.

The present invention is made in view of the above problems and aims to provide an organic EL element, display apparatus, and light-emitting apparatus each operate at low voltage to emit light at high intensity.

Solution to Problem

In order to achieve the aim stated above, an organic EL element according to one aspect of the present invention includes: an anode; a cathode; a functional layer disposed between the anode and the cathode, and including a light-emitting layer made of organic material; a hole injection layer disposed between the anode and the functional layer; and a bank that defines an area in which the light-emitting layer is to be formed, wherein the hole injection layer contains a tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83, an inner portion of the hole injection layer is depressed to define a recess, and an upper peripheral edge of the recess is covered with a part of the bank.

Advantageous Effects of Invention

An organic EL element according to the above-described aspect of the present invention, the hole injection layer contains a tungsten oxide and exhibits: by UPS measurement, a UPS spectrum having a protrusion appearing near a Fermi surface and within a region corresponding to a binding energy range lower than the top of a valence band; and by XPS measurement, that the tungsten oxide contained in the hole injection layer satisfies a condition that a ratio in number density of atoms other than tungsten atoms and oxygen atoms to the tungsten atoms is equal to 0.83 or smaller. This configuration achieves the clean surface of the hole injection layer, by removing adsorbates without affecting the energy level resulting from structures similar to oxygen vacancies of the tungsten oxide on the surface of the hole injection layer. Thus, the organic EL element operates at low voltage to emit light at high intensity.

Meanwhile, when the hole injection layer containing tungsten oxide has the above-described occupied energy level, there occurs a peculiar and new problem. In specific, in manufacturing process, film thickness of the hole injection layer decreases (hereinafter, this is referred to also as film loss). This might affect light-emitting characteristics, such as causing the unevenness in luminance in a light-emitting portion defined by banks or a decrease in service life of the organic EL element.

In view of this, one aspect of the present invention is an organic EL element having a concave structure. To be specific, in the area defined by the bank, the surface of the hole injection layer facing the functional layer (i.e., inner portion of the hole injection layer) has a recess, and a bottom surface of the recess is closer to the anode than an upper peripheral edge of the recess, and the upper peripheral edge of the recess is covered with a part of the bank. This can reduce concentration of the electric field occurring at the edge. This prevents problems such as the unevenness in luminance or a decrease in service life of the organic EL element. That is, it is possible to prevent the occurrence of effects on light-emitting characteristics.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

DETAILED DESCRIPTION

Figure 1:
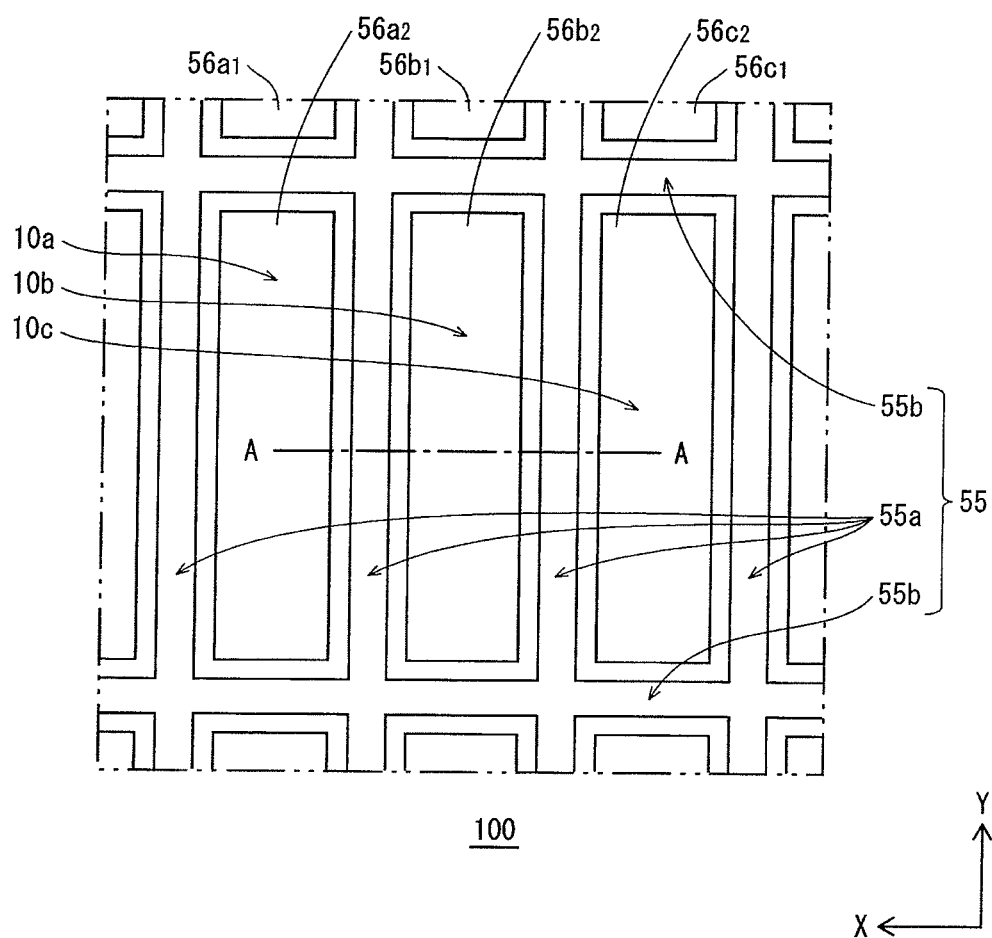
FIG. 1 is a plan view explaining an organic EL element pertaining to one aspect of the present invention.

[Outline of Aspects of the Present Invention]

A first aspect of the present invention provides an organic EL element that includes: an anode; a cathode; a functional layer disposed between the anode and the cathode, and including a light-emitting layer made of organic material; a hole injection layer disposed between the anode and the functional layer; and a bank that defines an area in which the light-emitting layer is to be formed, wherein the hole injection layer contains a tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83, an inner portion of the hole injection layer is depressed to define a recess, and an upper peripheral edge of the recess is covered with a part of the bank.

Furthermore, in a specific phase of the first aspect of the present invention directed to the organic EL element, in the UPS spectrum, the protrusion appears within the region corresponding to the binding energy range from approximately 1.8 eV to approximately 3.6 eV lower than the top of the valance band.

Note that a numerical range stated as "from . . . to . . ." is intended to mean that the upper and lower limits are both inclusive. For example, the numerical range "from 1.8 eV to 3.6 eV" includes both 1.8 eV and 3.6 eV.

Furthermore, in another specific phase of the first aspect of the present invention directed to the organic EL element, the ratio in the number density of the other atoms to the tungsten atoms does not exceed approximately 0.62. In this case, the adsorbate removal effect is considered to be saturated, and accordingly enough adsorbate removal effect is expected.

Furthermore, in a yet another specific phase of the first aspect of the present invention directed to the organic EL element, the atoms other than tungsten atoms and oxygen atoms comprise carbon atoms.

Furthermore, in a yet another specific phase of the first aspect of the present invention directed to the organic EL element, the part of the bank reaches a bottom of the recess of the hole injection layer, and a side surface of the bank slopes upward from the bottom of the recess to a top of the bank.

Furthermore, in a yet another specific phase of the first aspect of the present invention directed to the organic EL element, the part of the bank is out of contact with a bottom of the recess.

Furthermore, in a yet another specific phase of the first aspect of the present invention directed to the organic EL element, the hole injection layer extends laterally along a bottom surface of the bank.

Furthermore, in a yet another specific phase of the first aspect of the present invention directed to the organic EL element, the upper peripheral edge of the recess is a convex portion composed of (i) a part of the upper surface of the hole injection layer in which the recess is not formed and (ii) the inner side surface of the recess.

Furthermore, in a yet another specific phase of the first aspect of the present invention directed to the organic EL element, the hole injection layer is irradiated with ultraviolet light so that the hole injection layer in the UPS spectrum obtained from the UPS measurement has the protrusion appearing near the Fermi surface and within the region corresponding to the binding energy range lower than the top of a valence band, and the tungsten oxide contained in the hole injection layer satisfies the condition, as determined by the XPS measurement, that the ratio in the number density of atoms other than tungsten atoms and oxygen atoms to the tungsten atoms does not exceed approximately 0.83.

A second aspect of the present invention provides an organic EL element that includes: an anode; a cathode; a functional layer disposed between the anode and the cathode, and including a light-emitting layer made of organic material; a hole injection layer disposed between the anode and the functional layer; and a bank that defines an area in which the light-emitting layer is to be formed, wherein the hole injection layer contains a tungsten oxide, an Ultraviolet Photoelectron Spectroscopy (UPS) spectrum, obtained from an UPS measurement having: a protrusion appearing near a Fermi surface and within a region corresponding to a binding energy range lower than a top of a valence band, and a peak appearing within a region corresponding to a binding energy range from approximately 4.5 eV to approximately 5.4 eV, an inner portion of the hole injection layer is depressed to define a recess, and an upper peripheral edge of the recess is covered with a part of the bank.

Furthermore, in a specific phase of the second aspect of the present invention directed to the organic EL element, in the UPS spectrum, the protrusion appears within the region corresponding to the binding energy range from approximately 1.8 eV to approximately 3.6 eV lower than the top of the valance band.

Furthermore, in another phase of the second aspect of the present invention directed to the organic EL element, the hole injection layer is irradiated with ultraviolet light so that the hole injection layer, in the UPS spectrum, obtained by the UPS measurement, has: the protrusion appearing near the Fermi surface and within the region corresponding to the binding energy range lower than the top of the valence band, and the peak appears within the region corresponding to the binding energy range from approximately 4.5 eV to approximately 5.4 eV.

Furthermore, in a yet another specific phase of the second aspect of the present invention directed to the organic EL element, the part of the bank reaches a bottom of the recess of the hole injection layer, and a side surface of the bank slopes upward from the bottom of the recess to a top of the bank.

Furthermore, in a yet another specific phase of the second aspect of the present invention directed to the organic EL element, the part of the bank is out of contact with a bottom of the recess.

Furthermore, in a yet another specific phase of the second aspect of the present invention directed to the organic EL element, the hole injection layer extends laterally along a bottom surface of the bank.

Furthermore, in a yet another specific phase of the second aspect of the present invention directed to the organic EL element, the upper peripheral edge of the recess is a convex portion composed of (i) a part of the upper surface of the hole injection layer in which the recess is not formed and (ii) the inner side surface of the recess.

One aspect of the present invention provides a display apparatus that includes any of the above described organic EL elements.

One aspect of the present invention provides a light-emitting apparatus that includes any of the above described organic EL elements.

[Embodiments]

The following describes an organic EL element, a manufacturing method therefor, a display apparatus, and a light-emitting apparatus all according to one aspect of the present invention. Subsequently, the results of experiments conducted to confirm the performance of the organic EL element are described, followed by observations on the experimental results. Note that each figure is illustrated on a reduced scale different from the proportion of the actual sizes.

<Schematic Structure of Organic EL Element>

FIG. 1 is a plan view explaining an organic EL element pertaining to one aspect of the present invention.

A display apparatus 100 is a top-emission type display composed of organic EL elements 10a, 10b, and 10c each provided with a light-emitting layer having a color of either red (R), green (G), or blue (B) arranged in a matrix. Each organic EL element functions as a sub-pixel, and three adjacent organic EL elements of colors of RGB function as a pixel as a whole.

In an example of FIG. 1, a pixel bank 55 having a lattice shape is adopted. By a bank element 55a extending along a Y axis, light-emitting layers 56a1, 56b1, and 56c1 as well as light-emitting layers 56a2, 56b2, and 56c2 consecutively arranged along an X axis are partitioned.

On the other hand, a bank element 55b extending along the X axis delimits adjacent light-emitting layers 56a1 and 56a2 arranged along the Y axis, adjacent light-emitting layers 56b1 and 56b2 arranged along the Y axis, and adjacent light-emitting layers 56c1 and 56c2 arranged along the Y axis.

Figure 2:
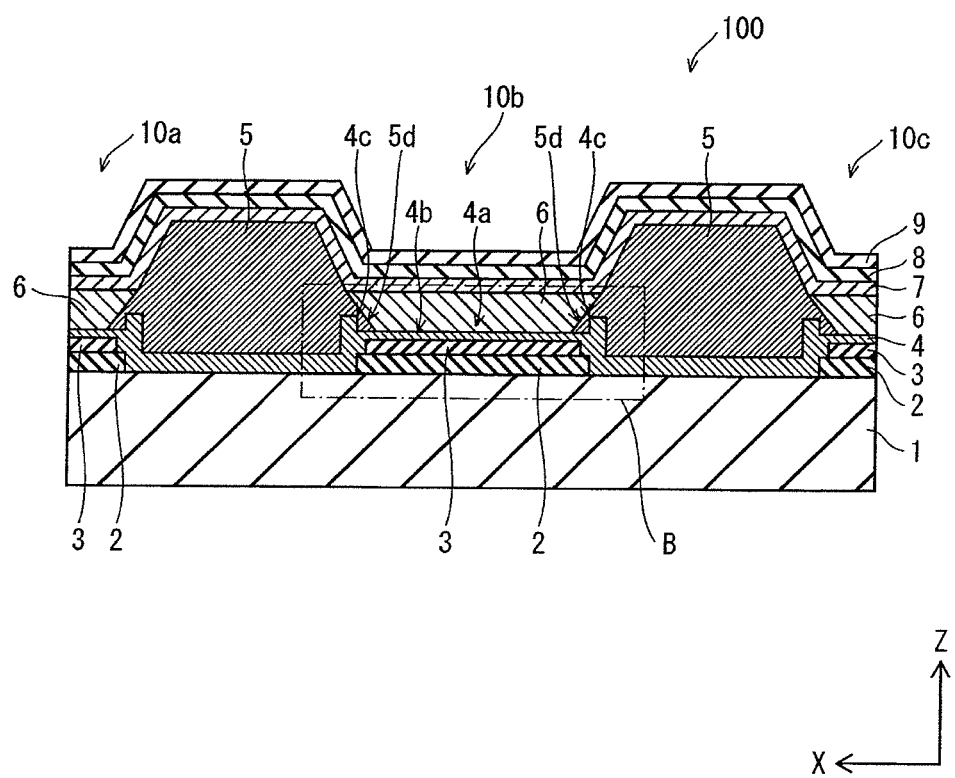
FIG. 2 is a schematic cross-sectional view illustrating a structure of the organic EL element pertaining to one aspect of the present invention.
Figure 3:
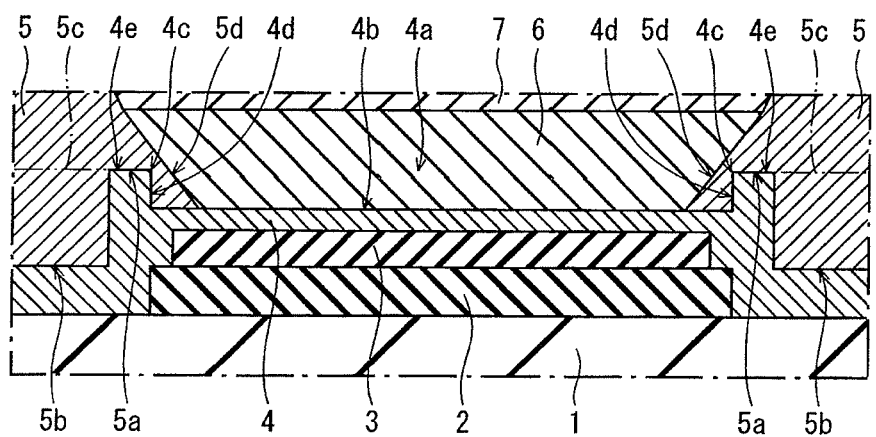
FIG. 3 is an enlarged end elevation of a portion B enclosed by an alternate long and short dash line of FIG. 2.

FIG. 2 is a schematic cross-sectional view illustrating a structure of the organic EL element pertaining to one aspect of the present invention taken along a line A-A of FIG. 1. FIG. 3 is an enlarged end elevation of a portion B enclosed by an alternate long and short dash line of FIG. 2.

On a TFT substrate 1 (hereinafter, simply referred to as a "substrate 1"), anodes 2 are formed in a matrix. On the anode 2, an ITO (indium tin oxide) layer 3 and a hole injection layer 4 are laminated in the stated order. Note that, while the ITO layer 3 is laminated only on the anode 2, the hole injection layer 4 is formed not only on the anode 2 but also over the substrate 1.

A bank 5 is formed above a periphery of the anode 2 via the hole injection layer 4. A light-emitting layer 6 is formed in an area defined by the bank 5. On the light-emitting layer 6, an electron injection layer 7, a cathode 8, and a passivation layer 9 are formed continuously across the consecutive organic EL elements 10a, 10b and 10c, passing over the bank 5.

<Structure of Each Component of Organic EL Element>

The substrate 1 is made from an insulating material such as alkali-free glass, soda glass, nonluminescent glass, phosphate glass, boric-acid glass, quartz, acrylic resin, styrene resin, polycarbonate resin, epoxy resin, polyethylene, polyester, silicon resin, and alumina.

The anode 2 is made of Ag (silver). Note that the anode 2 may be made of APC (alloy of silver, palladium and copper), ARA (alloy of silver, rubidium and gold), MoCr (alloy of molybdenum and chrome) or NiCr (alloy of nickel and chrome), for example. In a case of a top-emission type light-emitting element, it is preferable that the anode 2 be made of a light-reflective material. The anode 2 and the cathode 8 are connected to a direct current voltage source DC (unillustrated) to supply power to the organic EL elements 10a, 10b and 10c from the outside.

The ITO layer 3 is 50 nm thick, for example, and is interposed between the anode 2 and the hole injection layer 4, and has a function of improving the bond between these layers.

The hole injection layer 4 is 30 nm thick, for example, and is made from WOx (tungsten oxide). In the formula (WOx) representing the composition of tungsten oxide, x is a real number generally falling within the range of 2<x<3. Concerning the hole injection layer 4, it is preferable that the hole injection layer 4 consist of only tungsten oxide. However, the inclusion of a trace level of impurities is acceptable, provided that the amount does not exceed the amount of impurities which may be incorporated as a result of normal processing.

When the hole injection layer 4 is made from tungsten oxide, it is easy to inject holes, and electrons helps to emit light effectively in the light-emitting layer 6. Therefore, favorable luminescence property is obtained. The oxidization number of tungsten is plural, and therefore tungsten can have a plurality of levels. As a result, it becomes easy to inject holes, and drive voltage is reduced.

As shown in FIG. 3, the hole injection layer 4 extends laterally along bottom surfaces 5a and 5b of the bank 5, and has a recess 4a in an upper surface thereof. A bottom 4b of the recess 4a is lower than a level 5c of the bottom surface 5a of the bank 5. The recess 4a is made up of the bottom 4b and an inner side surface 4d continuing the bottom 4b. The depth of the recess 4a is approximately 5 nm to 30 nm. An upper peripheral edge 4c of the recess is a convex portion composed of (i) a part 4e of the upper surface of the hole injection layer 4 in which the recess is not formed and (ii) the inner side surface 4d of the recess. The upper peripheral edge 4c is covered with a covering part 5d, which is a part of the bank 5.

The upper peripheral edge 4c of the recess protrudes from the bottom 4b of the recess. Therefore, if the upper peripheral edge 4c is not covered with the covering part 5d made from an insulating material, electric field concentrates in the vicinity of the upper peripheral edge 4c of the recess, and localized flow of current occurs in the light-emitting layer 6. As a result, the uneven luminance occurs in a light-emitting surface and a life of the organic EL element is reduced due to localized deterioration of the light-emitting layer 6. In the present embodiment, however, the above-mentioned problems are prevented, because the upper peripheral edge 4c of the recess is covered with the covering part 5d made from an insulating material. Note that it is desirable that the thickness of the covering part 5d (a shortest distance between the upper peripheral edge 4c of the recess and the light-emitting layer 6) be 2 nm to 5 nm to effectively suppress the electric field concentration. In an example of FIG. 3, the part 4e of the upper surface of the hole injection layer 4 in which the recess is not formed makes a right angle with the inner side surface 4d of the recess to form the peripheral edge 4c of the recess. The peripheral edge 4c of the recess, however, may have a multiangular shape, or may be curved. In such a case, the electrical filed concentration is further suppressed.

In the present embodiment, the covering part 5d reaches the bottom 4b of the recess 4a, and a side surface of the bank 5 slopes upward from the bottom 4b of the recess to a top of the bank 5. With this structure, when the light-emitting layer 6 is formed using printing technology such as ink jet technology, it is possible to distribute ink to every corner of an area defined by the bank 5. As a result, formation of a void and the like is suppressed.

By being formed under the predetermined conditions, the resulting hole injection layer 4 is ensured to have, on its surface (including the bottom surface 4b and the side surface 4d of the recess 4a), the energy level resulting from structures similar to oxygen vacancies of the tungsten oxide. The presence of the energy level enables effective hole injections. In addition, subsequently to the layer formation, the hole injection layer 4 is irradiated with ultraviolet light of a predetermined wavelength in the atmosphere. As a result of the ultraviolet (UV) irradiation, the surface of the hole injection layer 4 (including the bottom surface 4b and the side surface 4d of the recess 4a) is cleaned to reduce adsorbates thereon, without affecting the energy level resulting from the structures similar to oxygen vacancies of tungsten oxide. In addition, the duration and intensity of UV irradiation is set so that, with respect to a photoelectron spectrum exhibited by the hole injection layer 4 after the UV irradiation, changes in shape of a spectral region corresponding to a predetermined range of binding energy converge (note that in this disclosure, the expression "converge" is used with the intention of indicating a state where the shape of the spectral region no longer changes). With the setting, the maximum effect of removing adsorbates is achieved by UV irradiation performed at the minimum conditions.

The bank 5 partitions the light-emitting layer 6 into sub-pixels. The bank 5 is made from an organic material, such as a resin, and has an insulating property. Examples of the organic material are an acrylic resin, a polyimide resin and a novolac-type phenolic resin. It is preferable that the bank 5 be resistant to organic solvent. Furthermore, the bank 5 can be subjected to an etching process, a baking process or the like. Therefore, it is preferable that the bank 5 be made from a highly resistant material so as not to be excessively deformed or degenerated by such processes.

The light-emitting layer 6 emits light by recombination of electrons and holes injected thereto. The light-emitting layer 6 is, for example, a 70 nm-thick layer of F8BT (poly(9,9-di-n-octylfluorene-alt-benzothiadiazole)), which is an organic polymer. However, the material to be used in forming the light-emitting layer 6 is not limited to this, and the light-emitting layer 6 may include a commonly-known organic material. For example, the light-emitting layer 6 may be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc., as recited in Japanese Patent Application Publication No. H5-163488.

The electron injection layer 7 has a function of transporting, to the light-emitting layer 6, an electron injected from the cathode 8. The electron injection layer 7 is 5 nm thick, for example. It is preferable that the electron injection layer 7 be formed from valium, phthalocyanine, fluorine lithium, or a combination of these materials.

The cathode 8 is 100 nm thick, for example, and is made of aluminum, ITO, IZO (indium zinc oxide), for example. A top-emission type light-emitting element preferably includes the cathode 8 made of a light-transmissive material.

The passivation layer 9 has a function of preventing the light-emitting layer 6 and so on from being exposed to moisture and air. The passivation layer 9 is made from a material such as SiN (silicon nitride) and SiON (silicon oxynitride). The passivation layer 9 is formed so as to encapsulate the organic EL elements 10a, 10b and 10c therein. Top-emission type organic EL elements 10a, 10b and 10c each preferably include the passivation layer 9 made of a light-transmissive material. It should be noted that, a sealing cap may be provided to isolate the entire organic EL elements 10a, 10b and 10c from external space, in order as to prevent atmospheric exposure of the organic EL elements 10a, 10b and 10c. When a sealing cap is additionally provided, the sealing cap may be formed of, for instance, the same material as the substrate 1, and a getter which absorbs moisture and the like may be provided within the space enclosed by the sealing cap.

Figure 4:
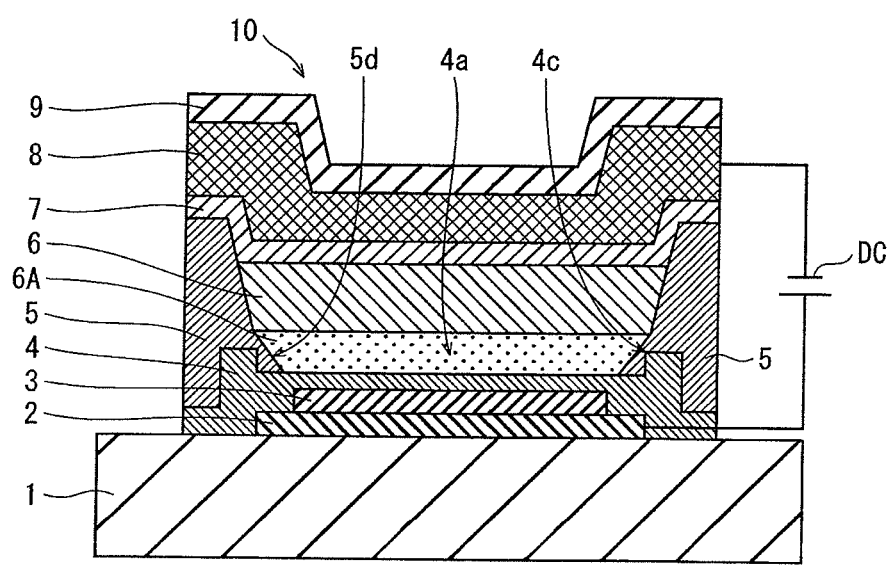
FIG. 4 is a schematic cross-sectional view illustrating a structure of an organic EL element pertaining to Modification.

In the organic EL elements 10a, 10b and 10c pertaining to the above embodiment, a buffer layer 6A used for adjusting optical characteristics and/or for blocking electrons may be provided between the hole injection layer 4 and the light-emitting layer 6, as shown in FIG. 4. The buffer layer 6A is a 20 nm-thick layer composed of TFB(poly(9,9-di-n-octylfluorene-alt-(1,4-phenylene-((4-sec-butyl phenyl)imino)-1,4-phenylene)), which is an amine-based organic polymer, for example.

A functional layer according to the present invention refers to one of a hole transport layer, a light-emitting layer, a buffer layer, an electron injection layer, an electron transport layer, and the like. Alternatively, a functional layer according to the present invention may refer to a combination of two or more of, or all of the above-mentioned layers. Although the target of the present invention is the hole injection layer, an organic EL element commonly includes layers having each of the functions of the above-described hole transfer layer, light-emitting layer and the like, in addition to the hole injection layer. As such, the expression "functional layer" refers to all such layers which need to be included in the organic EL element, in addition to the hole injection layer.

<Effects and Advantages Produced by the Organic EL Element>

As described above, the hole injection layer 4 of each of the organic EL elements 10a, 10b and 10c contains tungsten oxide. In addition, after the formation of the hole injection layer 4, a surface thereof is exposed to ultraviolet light of a predetermined wavelength. As a result, adsorbates on the surface of the holes injection layer 4 have been removed to a maximum, without affecting the energy level resulting from structures similar to oxygen vacancies present in tungsten oxide. This enables the organic EL element to be driven with low drive voltage and have longevity.

In addition, since a peripheral edge of the recess formed in the hole injection layer 4 is covered with a part of the bank, the electrical filed concentration at the peripheral edge of the recess is suppressed. This prevents problems such as the unevenness in luminance or a decrease in service life of the organic EL element. That is, it is possible to prevent the occurrence of effects on light-emitting characteristics.

<Manufacturing Method of Organic EL Elements>

FIGS. 5A, 5B, 5C, 6A, 6B, 6C, 7A, 7B, and 7C are each a process chart showing a method of manufacturing the organic EL element pertaining to one aspect of the present invention.

Figure 5A:
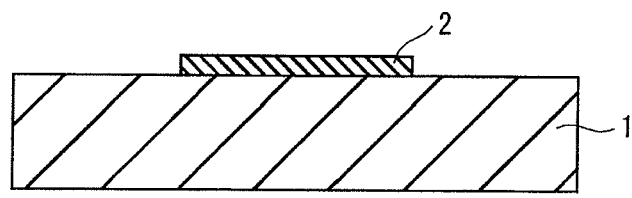
FIGS. 5A, 5B, and 5C are each a process chart showing a method of manufacturing the organic EL element pertaining to one aspect of the present invention.

Firstly, the substrate 1 is placed inside the chamber of a sputtering film-forming apparatus, for example. Then, a predetermined sputtering gas is introduced into the chamber to form a thin Ag film on the substrate 1 using the reactive sputtering method, as shown in FIG. 5A. The formed thin Ag film is then patterned using photolithography or the like to form in the anodes 2 in a matrix. Note that the thin Ag film may be formed using a vacuum evaporation method or the like.

Figure 5B:
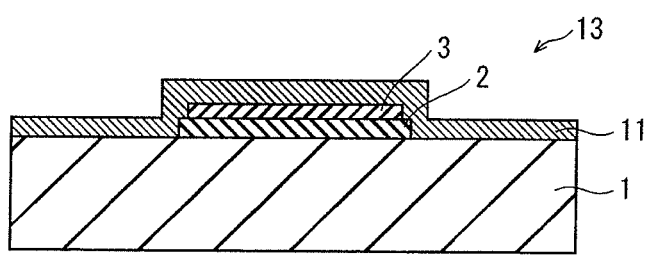

Next, as shown in FIG. 5B, a thin ITO film is formed using the reactive sputtering method or the like. The formed thin ITO film is then patterned using the photolithography or the like to form the ITO layer 3.

Subsequently, using a compound containing tungsten oxide, the thin tungsten oxide film 11 is formed by the vacuum deposition method or the reactive sputtering method so as to be uniform all over an upper surface of the substrate 1. More specifically, the reactive sputtering method is performed after replacing the previous sputtering target with metal tungsten, for example. Further, argon gas and oxygen gas are respectively introduced into the chamber as the sputtering gas and the reactive gas. Under this condition, the argon in the argon gas is ionized by the application of high voltage, and the ionized argon is caused to bombard the sputtering target. The metal tungsten ejected as a result of the sputtering phenomenon reacts with the oxygen gas, and produces tungsten oxide. As a result, the "sputtered" tungsten oxide forms the thin film 11 on the anode 2 of the substrate 1.

The film formation described above is performed under the following conditions: (i) the substrate temperature is not controlled; (ii) gas pressure (total gas pressure) is equal to 2.3 Pa; (iii) the ratio of oxygen partial pressure to the total gas pressure is equal to 50%; and (iv) input power per unit surface area of the sputtering target (input power density) is equal to 1.2 W/cm$^2$. The thin film 11 formed under the above conditions has the energy level resulting from structures similar to oxygen vacancies on its surface.

Figure 5C:
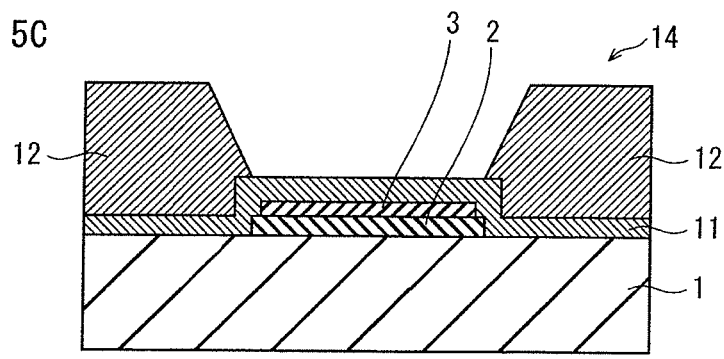

Next, as FIG. 5C shows, the bank 5 is formed by photolithography, for example, so as to surround each pixel region (region at which the anode 2 is provided). In such a case, a resist film (resin film, for example) 12 including resist material used as bank material is formed on the thin film 11 as a bank film by application or the like, and a resist pattern is formed on the resist film 12. After that, a desired portion of the resist film 12 is etched by applying a predetermined etchant (TMAH solution and the like) and is then removed so that patterning of the bank 5 is formed. The resist pattern is removed by an aqueous or non-aqueous release agent after the etching. Note that, when the bank 5 is formed from inorganic material, a CVD method or the like is used. Furthermore, a liquid-repellent treatment is applied to the surface of the bank 5, if necessary. Here, "resist film including resist material" refers to "resist film including resist material as bank material and formed as bank film".

Figure 6A:
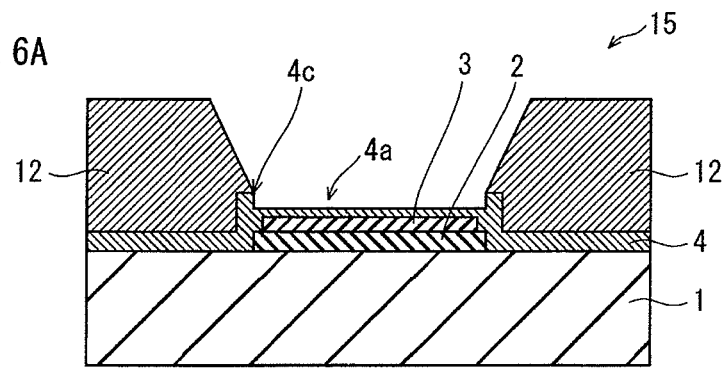
FIGS. 6A, 6B, and 6C are each a process chart showing the method of manufacturing the organic EL element pertaining to one aspect of the present invention.

Next, residues remaining after the etching are removed by being washed with hydrofluoric acid, pure water and the like. In this cleaning process, tungsten oxide, which is a material for the thin film 11, is soluble in pure water. Therefore, as shown in FIG. 6A, an exposed portion of the thin film 11 is eroded, and a recess is formed. As a result, the hole injection layer 4 having the recess 4a is formed.

Figure 6B:
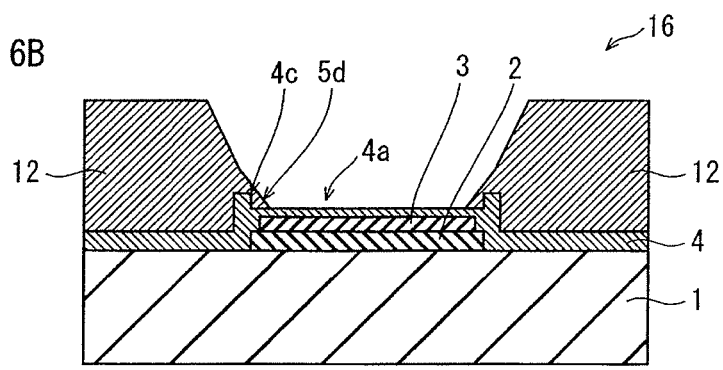

Next, as shown in FIG. 6B, the remaining portion of the bank material layer 12 is made fluid to some extent by heat treatment so that a bank material extends to cover the upper peripheral edge 4c of the recess. The upper peripheral edge 4c of the recess is covered with the covering part 5d in the above-mentioned manner. A heat cure can be adopted as the heat treatment, for example. The temperature and time for the heat cure may be appropriately determined in consideration of a type of the bank material and a required thickness of the covering part 5d and so on. After that, a surface of the remaining portion of the bank material layer 12 is, for example, subjected to treatment using fluorine plasma and the like to provide liquid repellency as necessary, and, as a result, the bank 5 is formed.

Figure 6C:
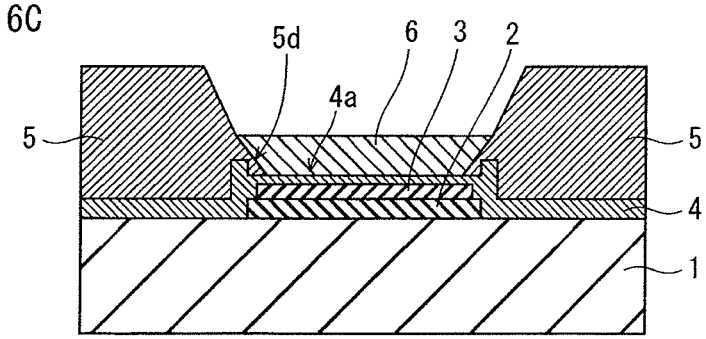

Subsequently, as shown in FIG. 6C, an ink composition including an organic EL material (hereinafter, simply referred to as "ink") is dropped in the area defined by the bank 5 by the inkjet method or the like. By drying the ink, the light-emitting layer 6 is formed.

It should be noted that in order to form the buffer layer 6A is formed between the hole injection layer 4 and the light-emitting layer 6, drops of ink composition containing organic amine-containing molecular material is ejected onto a surface of the hole injection layer 4 in the same manner before the light-emitting layer 6 is formed, and the solvent of the ink composition is removed by volatilization. Note that the method employed to form the buffer layer 6A and the light-emitting layer 6 is not limited to the specific method described above. Alternatively, the ink may be dripped or applied by a dispenser method, nozzle coating method, spin coat method, intaglio printing method, relief printing method or the like.

Figure 7A:
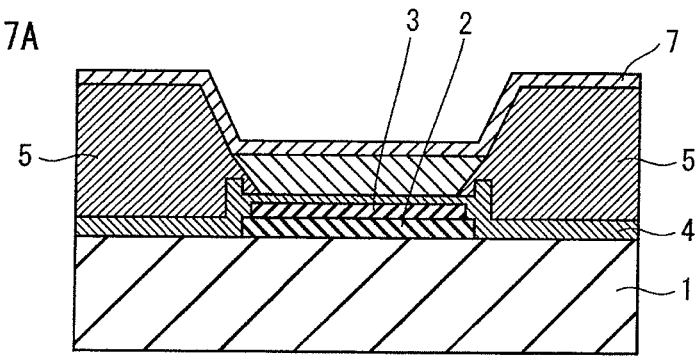
FIGS. 7A, 7B, and 7C are each a process chart showing the method of manufacturing the organic EL element pertaining to one aspect of the present invention.
Figure 7B:
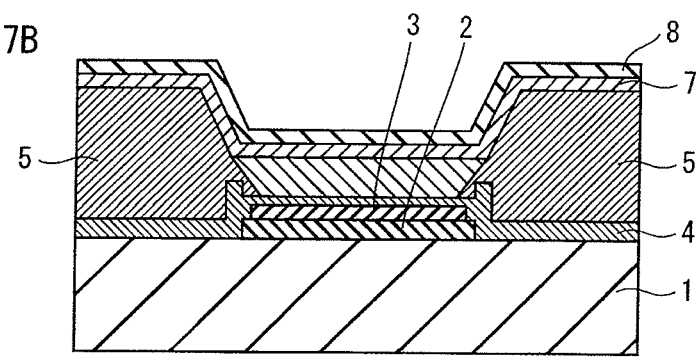
Figure 7C:
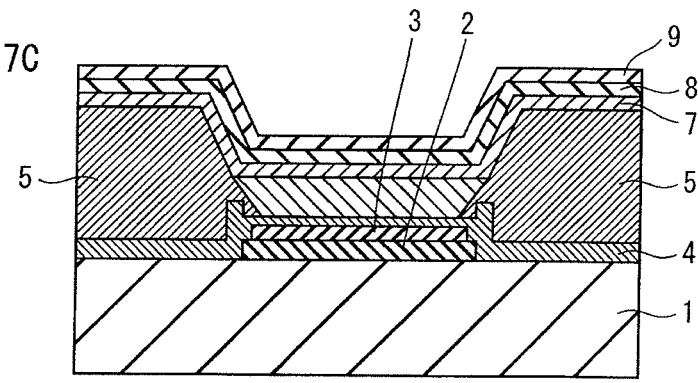

Next, as shown in FIG. 7A, a thin barium film as the electron injection layer 7 is formed using a vacuum evaporation method or the like. Then, as shown in FIG. 7B, an aluminum film as the cathode 8 is formed using a vacuum evaporation method. As shown in FIG. 7C, the passivation layer 9 is further formed.

During the above process, when an intermediate product is taken out of the chamber and exposed to the atmosphere after the thin film 11 is formed, the thin film 11 and the hole injection layer 4 (including the bottom surface 4b and the side surface 4d of the recess 4a) composed of the thin film 11 adsorbs gas molecules on their exposed surface. Also, impurity molecules present in the chamber adhere to the surface even before the intermediate product is taken out of the chamber.

As such, subsequently to formation of the thin film 11, the intermediate product that has not been provided with a functional layer (in the present embodiment, light-emitting layer 6 or buffer layer 6A) is irradiated with ultraviolet light in the atmosphere, whereby adsorbates are removed from the surface of the thin layer 11 or the hole injection layer 4. For example, the ultraviolet light is projected on the surface of the thin film 11 of the intermediate product 13 shown in FIG. 5B, the surface of the thin film 11 of the intermediate product 14 shown in FIG. 5C, the surface of the hole injection layer 4 of the intermediate product 15 shown in FIG. 6A, or the surface of the hole injection layer 4 of the intermediate product 16 shown in FIG. 6B.

When the thin film 11 is exposed to the atmosphere subsequently to the above-mentioned processes shown in FIGS. 5B and 5C, by projecting the ultraviolet light on the surface of the thin film 11 shown in FIG. 5B or FIG. 5C, the following effect is expected. That is, gas molecules or impurity attached to the surface of the thin film 11 can be promptly removed from an earlier stage. Further, as shown in FIGS. 6A and 6B, which are subsequent processes of FIGS. 5B and 5C, when part of the surface of the thin film 11 is lost, gas molecules or impurity attached to the surface of the thin film 11 can be removed with the lost film. When the amount of film loss and the depth of the adsorbates to the film have a certain relation, that is, when the amount of film loss is much greater than the depth of adsorbates, for example, it is possible to remove most of the adsorbates. In this case, it is assumed that there is less need to project the ultraviolet light on the thin film 11 exposed to the atmosphere after processes of FIGS. 5B and 5C. In contrast, when the amount of film loss is smaller than the depth of adsorbates, the adsorbates are assumed to remain on the thin film 11. Accordingly, it is preferable that the ultraviolet light be projected on the thin film 11 exposed to the atmosphere after processes of FIGS. 5B and 5C so as to remove the adsorbates.

Furthermore, when the thin film 11 is exposed to the atmosphere after processes of FIGS. 6A and 6B, projection of the ultraviolet light on the thin film 11 provides another effect. That is, residues of the bank 5 remaining on the surface of the thin film 11 can be removed together with molecules attached to the surface of the film.

Note that the ultraviolet light may be projected on any one of, or a combination of any two or more (including all) of the intermediate products 13, 14, and 16.

Figure 8:
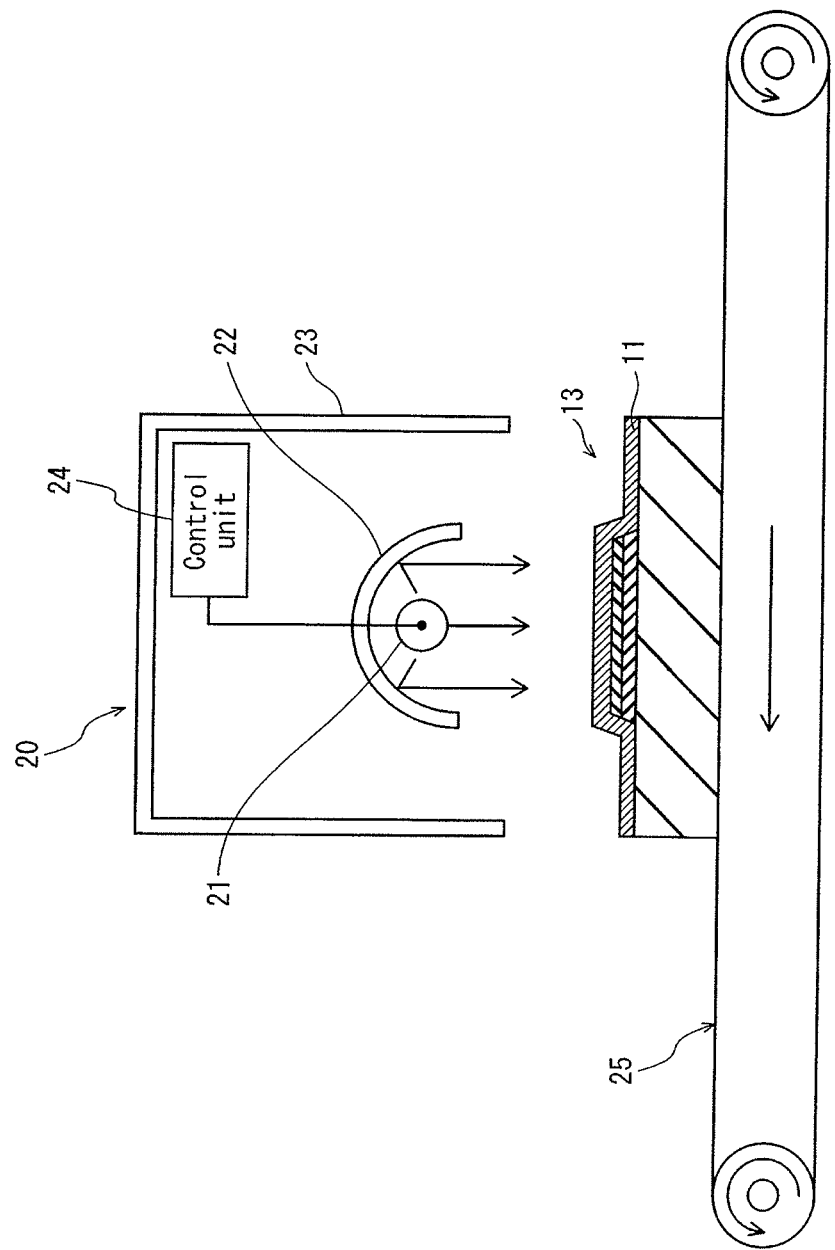
FIG. 8 explains a process of UV irradiation.

For example, as shown in FIG. 8, the surface of the thin film 11 of the intermediate product 13 shown in FIG. 5B is irradiated with the ultraviolet light by using an ultraviolet (UV) irradiation apparatus 20. The UV irradiation apparatus 20 has a metal halide lamp manufactured by Ushio Inc. (Model No.: UVL-3000M2-N) as a light source 21. The irradiation conditions are separately determined by experiments conducted using photoemission spectroscopy measurements, which will be described later. Specifically, the irradiation conditions are determined so that changes in shape of the resulting photoelectron spectrum in a spectral region corresponding to a predetermined binding energy range converge. In this embodiment, the irradiation intensity is determined to be 155 mW/cm$^2$ and the irradiation duration is determined to be 10 minutes. The UV irradiation apparatus 20 will be described later in detail.

<Effect of Manufacturing Method of Organic EL Elements>

The above-described manufacturing method of the organic EL elements 10a, 10b and 10c involves the UV irradiation step of irradiating ultraviolet light having the predetermined wavelength, performed after the hole injection layer 4 made of tungsten oxide is formed. With the step, adsorbates on the surface of the hole injection layer 4 are removed, while the energy level resulting from structures similar to oxygen vacancies of tungsten oxide is maintained on the hole injection layer surface.

Furthermore, the energy level mentioned above is continuously maintained in the atmosphere throughout the time from the cleaning of the hole injection layer 4 to the formation of the functional layer. Consequently, the ability of hole injection is maintained with stability. This ensures the stable manufacturing of the organic EL elements 10a, 10b and 10c that is driven with low drive voltage and has longevity.

Furthermore, the duration of UV irradiation and the intensity of ultraviolet light in the UV irradiation step are determined in view of the conditions with which, with respect to a photoelectron spectrum exhibited by the hole injection layer 4, changes in shape of a spectral region corresponding to a predetermined binding energy range converge. That is, the irradiation conditions are determined to achieve the maximum removable of adsorbates with the minimum conditions. Thus, the highly stable hole injection efficiency is realized with a minimum cleaning process.

Furthermore, even when the recess 4a is formed in an exposed portion of the hole injection layer 4 during manufacturing, the electrical field concentration in the vicinity of the upper peripheral edge 4c of the recess is suppressed because the upper peripheral edge 4c of the recess is covered with the covering part 5d and the light-emitting layer 6 is formed on the covering part 5d.

<UV Irradiation Apparatus>

Next, the following describes the UV irradiation apparatus. FIG. 8 illustrates an UV irradiation apparatus 20. The UV irradiation apparatus 20 is for irradiating an intermediate product 13 of the organic EL elements 10a, 10b and 10c with ultraviolet light and includes: a light source 21 that emits ultraviolet light mainly within the wavelength region longer than 184.9 nm and equal to 380 nm or shorter; a reflector 22 that reflects ultraviolet light emitted by the light source 21 toward the intermediate product 13; a housing 23 that houses the light source 21 and the reflector 22 to hold them in place; and a control unit 24 that controls ON/OFF of the light source 21.

The intermediate product 13 has, for example, the anode 2 and the thin film 11 composed of tungsten oxide layered on the substrate 1 but the light-emitting layer 6 has not been formed yet.

The light source 21 is, for example, a straight metal halide lamp disposed to longitudinally coincide with the widthwise direction of the intermediate product 13 being transferred. The light source 21 is operated to emit light under the conditions suitable for effective manufacturing of organic EL elements capable of emitting light at high intensity and low electrical consumption. The conditions of UV irradiation, such as irradiation duration and irradiation intensity, are determined based on various factors, including the formation conditions of the thin film 11 and the convergence of changes in shape of photoelectron spectroscopy spectra exhibited by the samples of the thin film 11 as described in the present embodiment. The irradiation conditions are set by the operator. Alternatively, the irradiation conditions may be automatically set by the control unit 24. For example, the control unit 24 stores a database in which layer forming conditions, irradiation durations, and irradiation intensities are correlated. On receiving input of the layer forming conditions by the operator, the control unit 24 sets the irradiation duration and intensity with reference to the database.

The intermediate product 13 is transported to the position for UV irradiation by a conveyer 25. In the figure, the intermediate product 13 placed onto the conveyer 25 from the upstream (right-hand side of the figure) in the transport direction is transported by the conveyer 25 to pass the position for receiving UV irradiation. While passing the position, a predetermined amount of ultraviolet light is applied to the upper surface of the intermediate product 13, i.e., the upper surface of the thin film 11. Having been irradiated with ultraviolet light, the intermediate product 13 is transported out to the downstream (left-hand side of the figure).

In the UV irradiation apparatus 20 described above, the light source 21 is not limited to a metal halide lamp. Alternately, the light source 21 may be any light source capable of emitting ultraviolet light mainly within the wavelength region longer than 184.9 nm and equal to 380 nm or shorter (preferably, longer than 253.7 nm and equal to 380 nm or shorter).

<Modification of Organic EL Elements>

Up to this point, an organic EL element according to one aspect of the present invention has been specifically described. In addition, an UV irradiation apparatus according to one aspect of the present invention has been specifically described. However, the specific embodiment(s) described above is an example used in order to clearly illustrate a structure of the present invention and the effects and advantages thereof. The present invention is not limited to the specific embodiment described above. For example, the sizes and/or materials specifically mentioned are merely typical examples used to make it easier to understand the present invention. The present invention is not limited to such a specific size and/or material. For example, the following modifications can also be implemented.

The hole injection layer according to one aspect of the present invention is not limited to a layer composed of only tungsten oxide. The hole injection layer may be any layer provided that it contains tungsten oxide. Accordingly, the hole injection layer may be made from Mo$_x$W$_y$O$_z$ (molybdenum-tungsten oxide), for example. Letting x+y=1, in the formula (Mo$_x$W$_y$O$_z$) representing the composition of molybdenum tungsten oxide, z is a real number generally falling within the range of 2<z<3. Note that the inclusion of a trace level of impurities in molybdenum tungsten oxide is acceptable, provided that the amount does not exceed the amount of impurities which may be incorporated as a result of normal processing. The hole injection layer made of molybdenum tungsten oxide yields the same technical effects as the hole injection layer made of tungsten oxide.

Further, the implementation of the organic EL element of the present invention is not limited to a structure where the organic EL element is used alone. A plurality of organic EL elements of the present invention may be integrated on a substrate as pixels to form an organic EL panel. An organic EL display so yielded may be implemented by appropriately arranging the thickness of each of the layers in each of the organic EL elements.

In the manufacture of organic EL panels using application-type organic EL elements, the step of integrating a plurality of organic EL elements as pixels on a substrate is performed in the following manner, for example. That is, banks defining the pixels are formed on the hole injection layer composed of tungsten oxide and a functional layer is overlaid within the regions defined by the banks. The step of forming the banks is performed in the following manner, for example. First, a bank material composed of photosensitive resist material is applied onto the surface of the hole injection layer, followed by pre-baking of the bank material. Then, the bank material is exposed to light via a pattern mask to remove unhardened, redundant bank material with a developer, followed by rinsing with pure water. The present invention is applicable to the hole injection layer composed of tungsten oxide having undergone the bank forming step as above. In this case, by performing the UV irradiation of the surface of the hole injection layer after the banks are formed, organic molecules, which are residues of banks and developer, are removed from the surface of the hole injection layer. In general, irradiating banks with ultraviolet light results in changes in the contact angle of each bank with respect to an organic solvent applied as an upper layer. Yet, according to the present invention, it is easy to uniformly deter mine the irradiation conditions of ultraviolet light. Therefore, the contact angle and the bank configuration can be appropriately adjusted in view of the uniformly determined irradiation conditions.

In the manufacturing method for organic EL elements, the UV irradiation is performed in the ambient atmosphere. Alternatively, however, the UV irradiation may be performed in various other gas atmospheres, such as reduced-pressure atmosphere, inert gas atmosphere, or vacuum. The above variations are possible because the cleaning by UV irradiation uses ultraviolet light at such wavelengths not generating oxygen radicals. Still, however, the UV irradiation performed in the atmosphere is advantages in the manufacture of large-sized panels, for the reasons stated above.

In the above embodiment, the recess in the hole injection layer is formed by being eroded by pure water during cleaning. However, an effect of suppressing the electrical filed concentration in the vicinity of the peripheral edge of the recess is obtained even when the recess is formed in another manner, by applying the present invention. For example, the recess may be formed by the hole injection layer being eroded by etching solution during etching, or by the hole injection layer being eroded by a release agent during removal of the resist pattern. As described above, the present invention is effective in a case where the hole injection layer is made from a material that is eroded when exposed to a liquid used for forming the bank, in particular, the hole injection layer is made from a material that is eroded when exposed to a liquid used while the hole injection layer is partially exposed.

Figure 9:
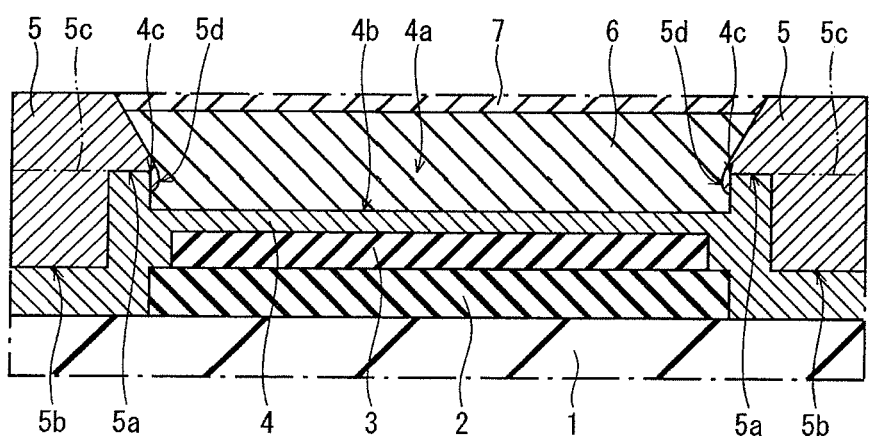
FIG. 9 is a schematic cross-sectional view illustrating a structure of the organic EL element pertaining to Modification.

In the above embodiment, the covering part extending from the bank reaches the bottom 4b of the recess beyond the upper peripheral edge 4c of the recess. However, the present invention is not limited to the above as long as at least the upper peripheral edge 4c of the recess is covered. For example, as shown in FIG. 9, the covering part 5d may be out of contact with the bottom 4b of the recess. When the structure shown in FIG. 9 is adopted, the temperature and time of the heat treatment are reduced, as it is not necessary to extend the bank material to the bottom of the recess.

In the above embodiment, the recess 4a of the hole injection layer 4 is formed by cleaning after development in the process of forming the bank. In the present invention, however, mask pattering or the like may be used as a method of forming the recess.

Figure 10A:
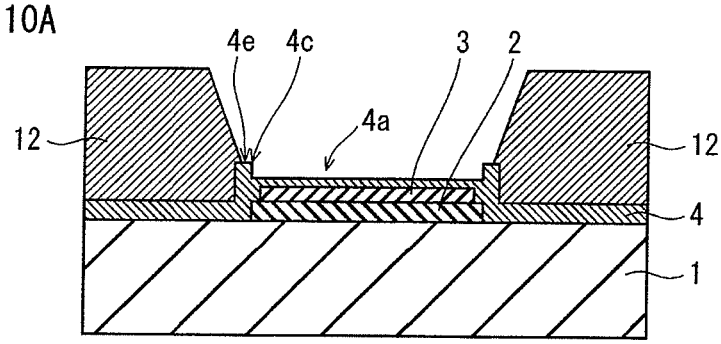
FIGS. 10A and 10B are each a process chart showing a method of manufacturing the organic EL element pertaining to Modification.
Figure 10B:
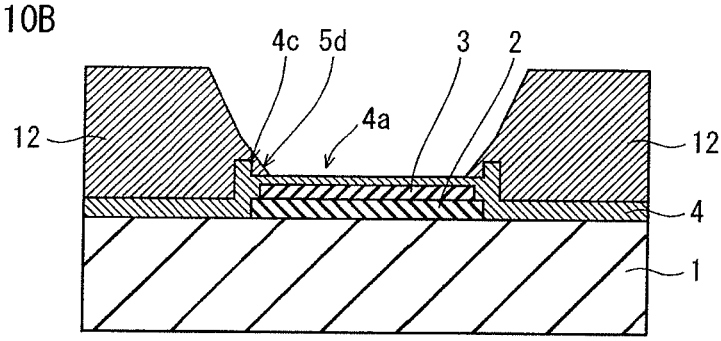

In FIG. 6A, although a lower end of the slope of the bank material 12 coincides with the upper peripheral edge 4c of the recess, the structure of the bank material 12 is not limited to this. Depending on the bank material, the part 4e of the upper surface of the hole injection layer 4 in which the recess is not formed may be partially exposed by the slope of the bank material 12 being set back, as shown in FIG. 10A. In such a case, by appropriately heat treating the bank material 12, the upper peripheral edge 4c of the recess is covered with a part of the bank material (see FIG. 10B).

Figure 11:
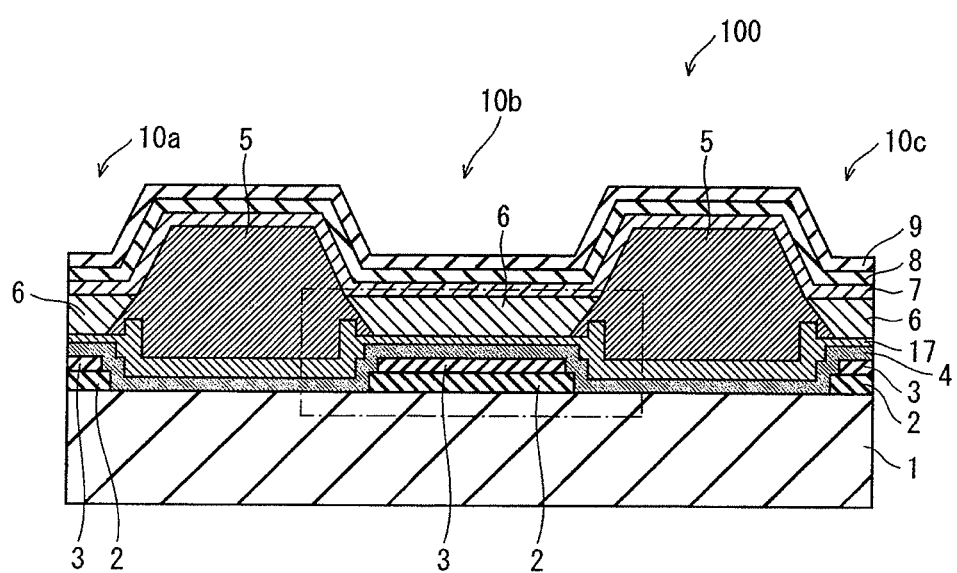
FIG. 11 is a schematic cross-sectional view illustrating a structure of the organic EL element pertaining to Modification.

In the above embodiment, as the charge injection transport layer, only the hole injection layer 4 is interposed between the anode and the light-emitting layer. However, the present invention is not limited to the above. For example, as shown in FIG. 11, a hole transport layer 17 may be formed on the hole injection layer 4, and these layers may be interposed as the charge injection transport layer. In this case, the recess is formed in an upper surface of the hole transport layer 17, and an upper peripheral edge of the recess formed in the hole transport layer is covered with the covering part.

In specific, the hole injection layer and the hole transport layer may be formed as shown in a portion B of FIG. 11. That is, when the upper peripheral edge 4c of the recess 4a formed in the hole injection layer 4 is covered with the covering part 5d of the bank 5, a hole transport layer 17 may be formed on the recess 4a of the hole injection layer 4 by applying ink including hole transporting material, and a light-emitting layer 6 may be formed on the hole transport layer 17 by applying ink including light-emitting material.

In addition, the thickness of the hole transport layer 17 is 10 nm to 20 nm, and the hole transport layer transports, to the light-emitting layer 6, holes injected from the hole injection layer 4. The hole transport layer 17 is made of hole transporting organic material. The hole transporting organic material transports generated holes by using intermolecular charge transfer reaction. This material is also referred to as p-type organic semiconductor material.

The hole transport layer may be made of high-polymer material or low-molecular material. In any of both cases, the hole transport layer is formed by wet printing. It is preferable that the hole transport layer include a cross-linking agent so that the hole transport layer is unlikely to be dissolved in the organic light-emitting layer when the organic light-emitting layer is formed on the hole transport layer. Examples of the hole transporting organic material may include copolymer including fluorine units and triarylamine units, and low-molecular-weight triarylamine derivative. Examples of a cross-linking agent may include dipentaerythritol hexaacrylate and the like. In this case, it is preferable that the agent be made of doped polystyrene sulfonic acid, i.e., poly (3,4-ethylenedioxythiophene) (PEDOT-PSS) or its derivative (such as copolymers).

In the above embodiment, since the anode 2 is formed from the thin Ag film, the ITO layer 3 is formed on the anode 2. When the anode 2 is formed from an Al-based material, it is possible to adopt a single layer structure of the anode without forming the ITO layer 3.

Figure 12:
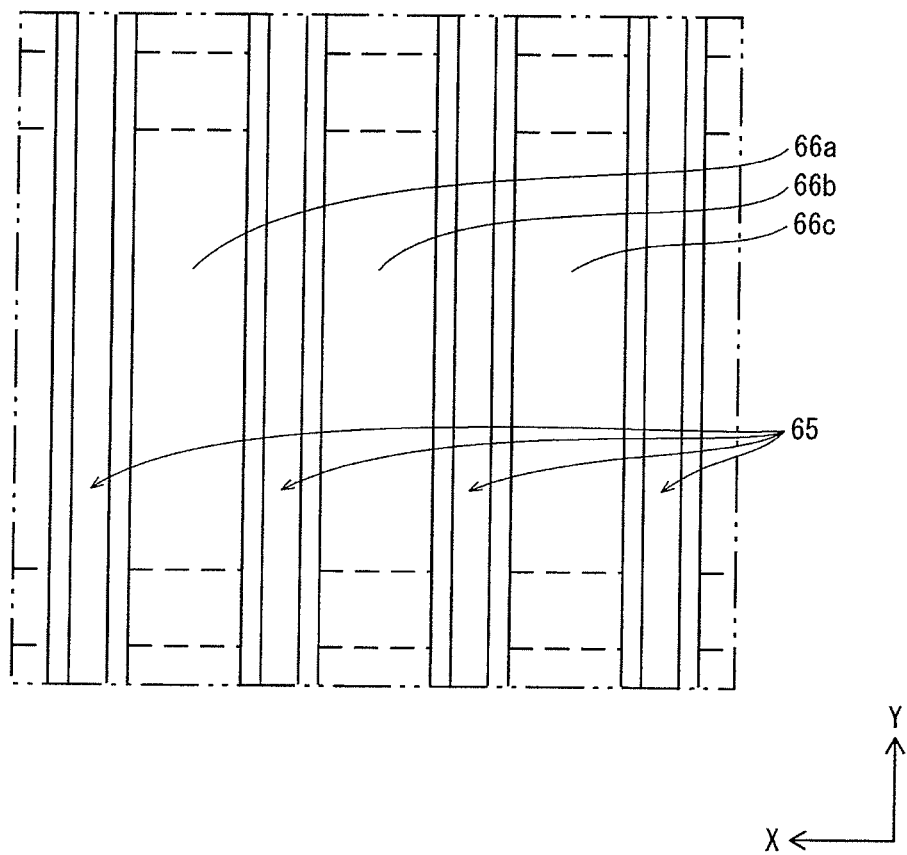
FIG. 12 is a plan view explaining the organic EL element pertaining to Modification.

In the above embodiment, although the so-called pixel bank (a bank having a lattice shape) is adopted, the present invention is not limited to this. For example, a line bank (banks arranged in lines) may be adopted. In an example of FIG. 12, the line bank 65 is adopted. The line bank 65 delimits consecutive light-emitting layers 66a, 66b, and 66c arranged along the X axis. Note that when the line bank 65 is adopted as shown in FIG. 12, adjacent light-emitting layers arranged along the Y axis are not defined by the bank element. However, by appropriately determining a driving method, a size of the anode, an interval between the anodes and so on, the adjacent light-emitting layers emit light without influencing each other.

In the above embodiment, although a top-emission type light-emitting element is adopted, the light-emitting element of the present invention is not limited to the top-emission type light-emitting element. A bottom-emission type light-emitting element may be adopted.

In the above embodiment, although only the electron injection layer is interposed between the light-emitting layer and the cathode, the electron transport layer may be interposed in addition to the electron injection layer.

In the above embodiment, although organic material is used as a bank material, inorganic material may also be used. In this case, the bank material layer may be formed by application or the like, in the same way as when organic material is used. The portion of the bank material layer may be removed by forming a resist pattern on the bank material layer, and then performing etching with use of predetermined etchant (Tetramethylammonium hydroxide (TMAH) solution, etc.). The resist pattern is removed by an aqueous or non-aqueous release agent after the etching, for example. Next, residues remaining after the etching are removed by being washed with pure water. Here, tungsten oxide, which is a material for the thin film 11, is soluble in pure water. Therefore, as shown in FIG. 6A, an exposed portion of the thin film 11 is eroded, and a recess is formed. As a result, the hole injection layer 4 having the recess 4a is formed. Hence, the present invention can be applied to banks made of inorganic material, in the same way as when banks made of organic material.

<Study and Experiments>

With the aim of preventing increase in drive voltage of the organic EL element and reduction in longevity of the organic EL element, the present inventors have come to a technical idea of adding, to the manufacturing process, a cleaning step of removing adsorbates from the layer surfaces subsequently to the formation of the respective layers.

As the cleaning methods for removing adsorbates, the present inventors have turned their attention to ultraviolet (UV) ozone cleaning and oxygen plasma cleaning, which are widely used for cleaning glass substrates and electrodes, for the high degree of cleanliness achieved thereby.

Intensive studies by the present inventors on the cleaning methods have revealed that neither UV ozone cleaning nor oxygen plasma cleaning is suitable for cleaning the hole injection layer of an organic EL element, provided that the hole injection layer is containing tungsten oxide.

The reason is as follows. Both the UV ozone cleaning and oxygen plasma cleaning utilize strong oxidation associated with oxygen radicals formed by decomposition of oxygen molecules. Through the oxidation, oxygen atoms end up filling structures similar to oxygen vacancies of metal oxide on the surface of the hole injection layer. Consequently, the energy level resulting from structures similar to oxygen vacancies disappears from the hole injection layer containing tungsten oxide. As a result, there is a risk of decreasing the hole injection efficiency. To be more precise, the present inventors have confirmed, by experiments described below, that the energy level resulting from structures similar to oxygen vacancies almost completely disappear through UV ozone cleaning.

Based on the above findings, the present inventors have recognized the importance of the following two points in order to prevent increase in the drive voltage of, and decrease in the longevity of an organic EL element having a hole injection layer containing tungsten oxide. One of the points is that the energy level resulting from structures similar to oxygen vacancies of tungsten oxide on the surface of the hole injection layer remains without being eliminated. The other of the points is that adsorbates are removed from the surface the hole injection layer.

After a series of researches and studies regarding the above features of the present invention, the present inventors came to be aware of Non-Patent Literature 1 disclosing UV ozone cleaning performed subsequently to the formation of a hole injection layer composed of tungsten oxide. However, Non-Patent Literature 1 discloses nothing about the impact on the characteristics of the organic EL element imposed by UV ozone cleaning and nothing about optimizing the conditions of UV ozone cleaning. It is further noted that Non-Patent Literature 1 does not describe anything about the fact, which are found by the present inventors through specific studies, that UV ozone cleaning is not suitable for cleaning a hole injection layer containing tungsten oxide unless adequately modified. Naturally, Non-Patent Literature 1 does not describe anything about the technical reasons for the unsuitability.

As another method for removing adsorbates, the following discusses sputter etching of performing argon ion sputtering in a vacuum chamber subsequently to a hole injection layer is formed. The sputter etching has been reported to remove adsorbates and also to increase the energy level resulting from structures similar to oxygen vacancies. Thus, the sputter etching appears to be an excellent cleaning method at first.

Unfortunately, the clean surface and the increased energy level obtained by the sputter etching can be maintained only in the vacuum chamber for the following reason. That is, the surface of a hole injection layer treated by sputter etching in vacuum is highly instable because the molecular bonds have been forcedly broken by an ion beam. Therefore, once taken out of the vacuum chamber, the hole injection layer easily adsorbs atmospheric molecules to be stabilized. In the manner described above, structures similar to oxygen vacancies of tungsten oxide which are created in vacuum are instantly filled, and the layer surface once cleaned rapidly adsorbs contaminants.

The layer surface may be kept clean by performing some or all of the subsequent manufacturing steps continuously inside the vacuum chamber. However, performing manufacturing steps inside a vacuum chamber is applicable, on condition that the organic EL panel to be manufactured is relatively small. For a large-sized organic EL panel having display size of e.g., around 50 inches, it is extremely difficult to perform the manufacturing steps inside a vacuum chamber as the vacuum chamber needs to be large enough for such a large-sized organic EL panel. Besides, the throughput of steps performed inside a vacuum chamber is small, and such steps are not desirable for mass production.

Alternatively to removing adsorbates, a method of preventing adhesion of contaminants per se is one possibility. For example, by performing some or all of manufacturing steps subsequent to the layer formation continuously inside a vacuum chamber, the respective layers are exposed neither to the atmosphere nor to impurity molecules. Thus, the layer surface is kept free or substantially free of contaminants. However, this scheme is extremely difficult to apply to the manufacturing of large-sized organic EL panels because the vacuum chamber of a corresponding size is required as already described above.

Alternatively, performing manufacturing steps inside a chamber filled with inert gas is another possibility. This scheme is applicable to the manufacturing of large-sized organic EL panels. Unfortunately, such a chamber still contains impurity molecules and the like, although the amount is smaller than that in the atmosphere. In addition, complete removal of such molecules from the chamber is difficult.

As has been described above, it is extremely difficult to obtain an organic EL element having a hole injection layer satisfying that (i) the energy level resulting from structures similar to oxygen vacancies of tungsten oxide on the layer surface remains without being eliminated and (ii) the surface of the hole injection layer is free or substantially free of adsorbates.

In contrast, an organic EL element according to one aspect of the present invention includes a hole injection layer having an energy level resulting from structures similar to oxygen vacancies of tungsten oxide on the surface of the hole injection layer remains without being eliminated. Therefore, holes are injected from the anode to the functional layer with efficiency. Consequently, the organic EL element emits light at low power consumption and high intensity. In addition, since adsorbates have been removed from the surface of the hole injection layer, no or substantially no contaminants are embedded between the hole injection layer and the functional layer. As a consequence, the drive voltage of the organic EL element is not increased and no carrier traps, such as impurities derived from adsorbates, are formed, which ensures a long life and favorable characteristics of the organic EL element.

(1) Effect of Adsorbates Removal by UV Irradiation

According to this embodiment, subsequently to its formation, the hole injection layer 4 composed of tungsten oxide is exposed to ultraviolet light under the predetermined conditions, whereby adsorbates are removed from the surface of the hole injection layer 4. The adsorbate removal effect achieved by the UV irradiation is confirmed by the following experiments.

By the manufacturing method according to the present embodiment, samples were prepared each by laminating the anode 2 composed of ITO on the substrate 1, and the hole injection layer 4 composed of tungsten oxide on the anode 2, in the chamber of the sputtering film-forming apparatus. After the lamination, each intermediate sample was taken out of the chamber to the atmosphere to prepare samples without any UV irradiation, samples with UV irradiation for one minute, and samples with UV irradiation for ten minutes. The irradiation intensity was 155 mW/cm$^2$.

In the following description in the present embodiment, a sample without UV irradiation may be referred to as a "no-irradiation sample" and a sample with UV irradiation for n minutes may be referred to as an "n-minute irradiation sample".

Each sample was then attached to a photoelectron spectroscopy apparatus (PHI 5000 VersaProbe) manufactured by ULVAC-PHI, Incorporated to measure the X-ray photoelectron spectroscopy (XPS). Generally, an XPS spectrum indicates the elemental composition, binding condition, and valence of the target surface up to several nanometers in depth. That is, if elements not originally contained in tungsten oxide are observed, it is highly likely that the elements are adsorbates. In addition, it is generally known that molecules adhere as a result of atmospheric exposure or during a manufacturing process are mainly carbon-containing molecules, if water molecules and oxygen molecules are excluded. Therefore, the adsorbate removal effect achieved is confirmed by measuring changes in the carbon concentration in the surface region of the hole injection layer 4.

The conditions under which the XPS measurement was conducted are as follows. Note that no charge-up occurred during the measurement.
Light source: Al Kα
Bias: None
Electron emission angle: Normal line direction to the substrate surface First, each sample was subjected to wide-scan measurement. As a result of the measurement, the only elements found in each sample were tungsten (W), oxygen (O), and carbon (C). Then, narrow-scan spectra of each sample were measured for the W4f orbital (W4f) and also for the C1s orbital (C1s) to obtain the relative value of the number density of carbon atoms to the number of density of tungsten atoms present in the surface region up to several nanometers in depth of the hole injection layer 4 composed of tungsten oxide. That is, the composition ratio between W and C was obtained. The composition ratio was obtained from the spectra, by using the composition ratio calculation function of "MultiPak" XPS, which is analyzing software included with the photoelectron spectroscopy apparatus used in the measurements.

Table 1 below shows the composition ratio between W and C of each sample.

TABLE 1

| Sample Name | Composition Ratio between W and C (W:C) |
| --- | --- |
| No-Irradiation Samples | 1:1.27 |
| 1-Minute Irradiation Samples | 1:0.83 |
| 10-Minute Irradiation Samples | 1:0.62 |

With reference to Table 1, the number of carbon atoms relative to the number of tungsten atoms decrease more and more as the irradiation duration is longer, which is apparent when comparing the samples without irradiation against the samples with 1-minute irradiation and the samples with 10-minute irradiation. That is, it is made clear that the UV irradiation according to the present embodiment serves to decrease adsorbates on the surface of the hole injection layer 4 composed of tungsten oxide.

(Influences of UV Irradiation on Hole Injection Ability)

According to the present embodiment, the UV irradiation is performed to remove adsorbates from the surface of the hole injection layer 4 composed of tungsten oxide, in a manner that the energy level resulting from structures similar to oxygen vacancies is maintained without any substantial influence. Note that the structures similar to oxygen vacancies favorably affect the hole injection ability. This property of maintaining structures similar to oxygen vacancies is confirmed by the following experiments.

In the experiments, the above-described samples without irradiation, with 1-minute irradiation, and with 10-minute irradiation were subjected to UPS (ultraviolet photoelectron spectroscopy) measurements. Generally, a UPS spectrum indicates the electronic state, from the valence band to the Fermi surface (Fermi level), of the measurement target surface of up to several nanometers in depth. Especially in the case where the measurement target is tungsten oxide or molybdenum oxide, the presence of structures similar to oxygen vacancies on the layer surface is indicated by a protrusion appearing, in a UPS spectrum, near the Fermi surface in the low binding energy direction from the top of the valence band (hereinafter, such a protrusion is referred to as a "spectral protrusion near the Fermi surface") (Non-Patent Literature 2 and 3). That is, by observing changes in the spectral protrusion near the Fermi surface before and after UV irradiation, the influence imposed by the UV irradiation on the structures similar to oxygen vacancies on the layer surface is examined. In tungsten oxide, the spectral protrusion near the Fermi surface occupies a binding energy range that is from 1.8 eV to 3.6 eV lower than the top of the valence band (the lowest binding energy within the valence band).

The conditions under which the UPS measurement was conducted are as follows. Note that no charge-up occurred during the measurement.

Figure 13:
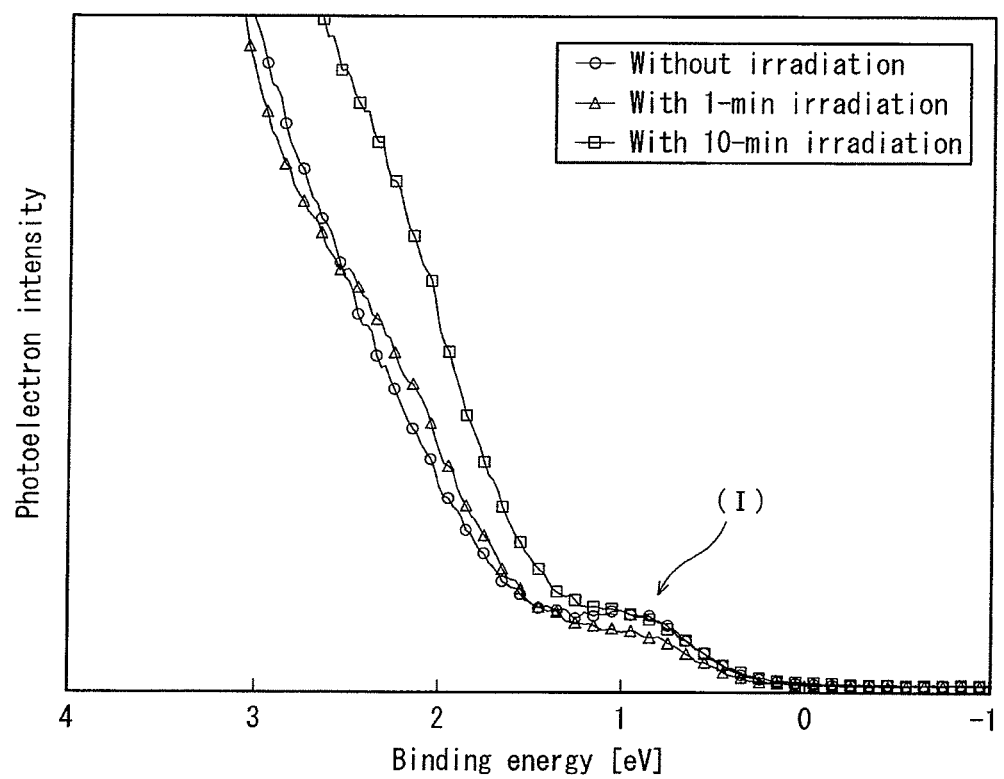
FIG. 13 is a view illustrating UPS spectra of tungsten oxide.

Light source: He I
Bias: None
Electron emission angle: Normal line direction to the substrate surface FIG. 13 shows the UPS spectra of the respective samples, focusing on portions near the Fermi surface. In the following description, every photoelectron spectroscopy spectrum (UPS and XPS) is shown with the horizontal axis representing the binding energy having the origin point in the Fermi surface and with the left direction relative to the origin point being positive. In all the spectra measured on the samples without irradiation, with 1-minute irradiation, and with 10-minute irradiation, a spectral protrusion near the Fermi surface is clearly observed. In the figure, spectral protrusions near the Fermi surface are collectively denoted by (I). These results indicate that the structures similar to oxygen vacancies favorably affecting the hole-injection ability are maintained even after the UV irradiation.

For the purpose of comparison, UV ozone cleaning was also performed. More specifically, samples were prepared each by laminating the anode 2 composed of ITO on the substrate 1, and the hole injection layer 4 composed of tungsten oxide on the anode 2, in the chamber of a sputtering film-forming apparatus. The intermediate samples were than taken out of the chamber to the atmosphere, followed by UV ozone cleaning of the surface of the hole injection layer 4 by a UV ozone apparatus. The samples after the UV ozone cleaning were subjected to UPS measurement to check the presence of a spectral protrusion near the Fermi surface.

Figure 14:
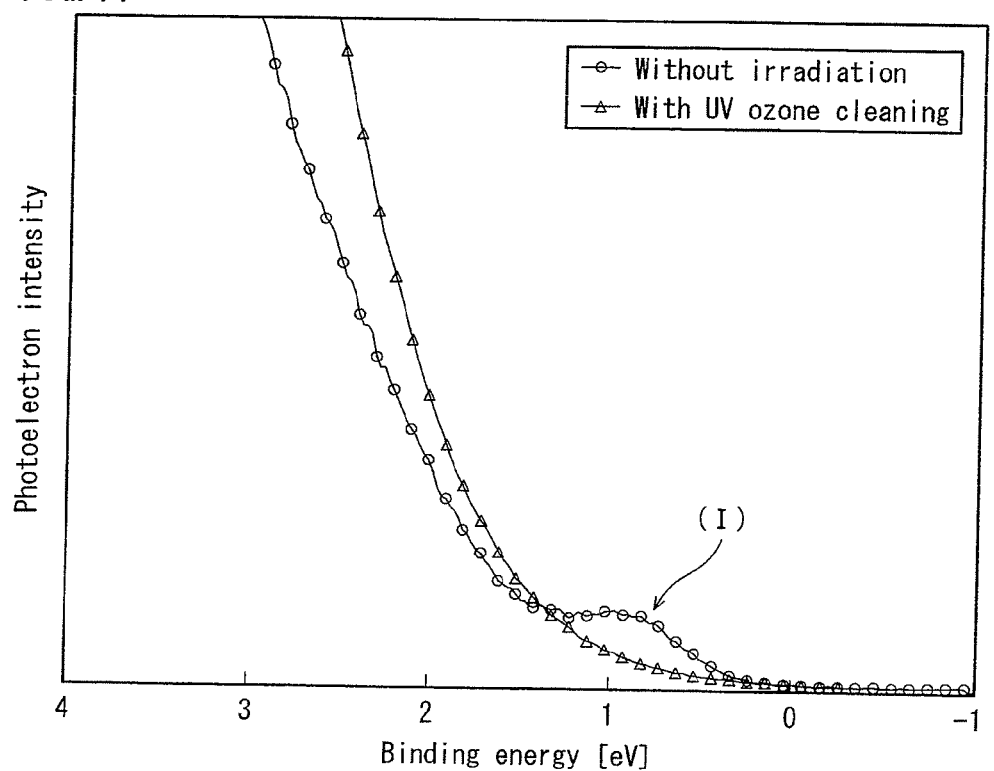
FIG. 14 is a view illustrating UPS spectra of tungsten oxide.

FIG. 14 illustrates the UPS spectrum measured on the hole injection layer 4 composed of tungsten oxide having been subjected to the UV ozone cleaning for three minutes, focusing on a portion near the Fermi surface. For the purpose of comparison, FIG. 14 also illustrates the UPS spectrum of the samples without irradiation, which is illustrated in FIG. 13. Different from the results shown in FIG. 13 regarding the samples subjected to the UV irradiation according to the present embodiment, no spectral protrusion near the Fermi surface is observed at all. The results indicate that through the UV ozone cleaning, almost all structures similar to oxygen vacancies are lost from the surface of the hole injection layer 4.

As described above, it is clarified that cleaning by the UV irradiation according to the present embodiment is different from the UV ozone cleaning in that structures similar to oxygen vacancies are maintained without being lost. That is, structures similar to oxygen vacancies, which favorably affect the hole injection ability, are not eliminated by the UV irradiation.

(2) Regarding Method for Determining UV Irradiation Conditions

According to the present embodiment, the surface of the hole injection layer 4 composed of tungsten oxide is cleaned by UV irradiation. It is confirmed by the following experimental results that the adsorbate removal effect becomes saturated with the irradiation for a specific duration or longer.

Figure 15:
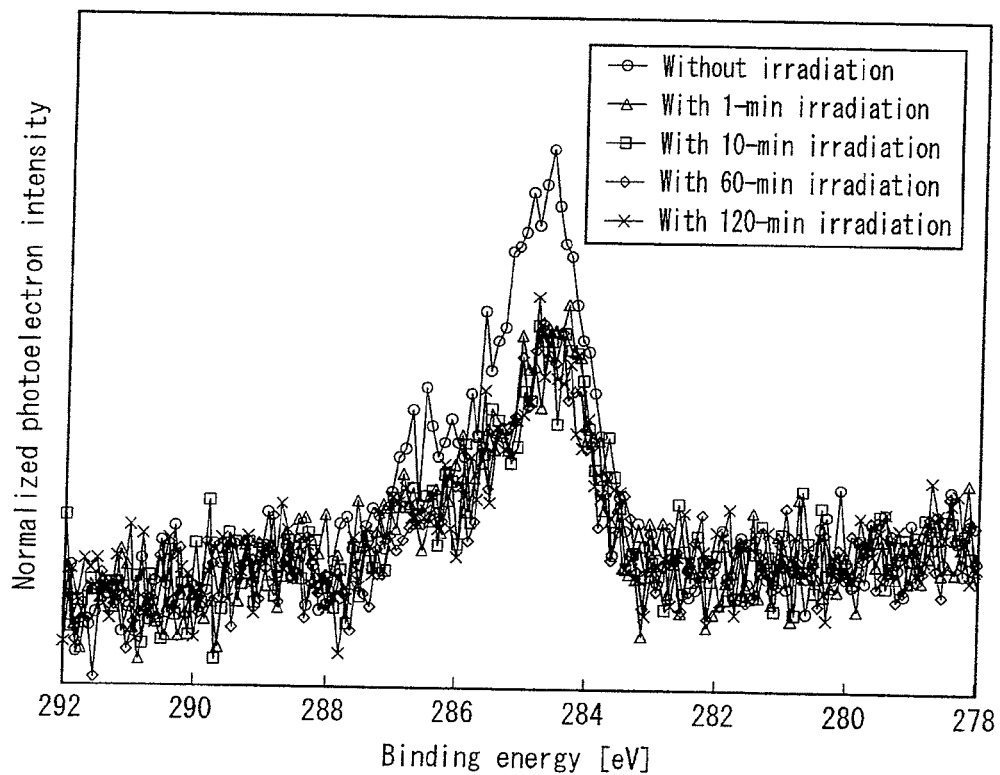
FIG. 15 is a view illustrating XPS spectra of tungsten oxide.

In the same manner as described above, samples without irradiation, with 1-minute irradiation, and with 10-minute irradiation were prepared. In addition, samples with 60-minute irradiation and 120-minute irradiation were prepared. Then, narrow-scan spectra for W4f and C1s of the respective samples were measured by XPS measurement. From the respective spectra, background components are subtracted. Then, the photoelectron intensity is normalized using the area intensity of the narrow-scan spectrum for W4f. The narrow-scan spectra for C1s of the respective samples are shown in FIG. 15. The area intensity of each C1s spectrum illustrated in FIG. 15 is proportional to the ratio of the number density of carbon atoms to the number density of tungsten atoms, all of which were present in the surface region of the hole injection layer 4 composed of tungsten oxide up to several nanometers in depth from the layer surface.

According to FIG. 15, the C1s spectra measured on the samples with 1-minute irradiation or longer are all substantially equal in intensity. This indicates that the adsorbate removal effect has substantially reached a level of saturation with the irradiation for the duration of one minute or longer.

Generally, a C1s spectrum tends to be low in intensity and roughly irregular as shown in FIG. 15, because the amount of adsorbates is intrinsically small. Therefore, C1s spectra may not serve the best in determining saturation of the adsorbate removal effect. In view of this, the following describes other methods involving the use of spectra of relatively strong intensity, for determining saturation of the adsorbate removal effect.

The first of such a method is to make a saturation determination based on changes in the shape of a UPS spectral region corresponding to a range of binding energy around the top of the valence band (i.e., the UPS spectral region corresponding to the binding energy range from 4.5 eV to 5.4 eV). A peak or shoulder appearing in the spectral region indicates a lone pair of electrons in the 2p orbital in oxygen atoms constituting tungsten oxide.

Figure 16:
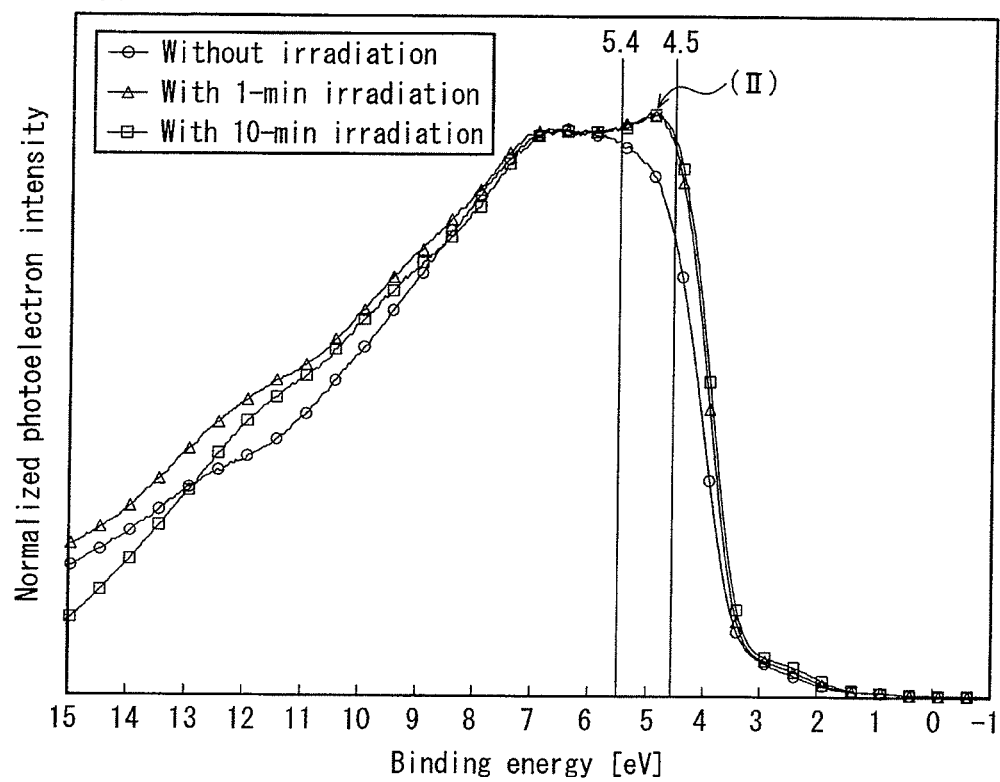
FIG. 16 is a view illustrating UPS spectra of tungsten oxide.

FIG. 16 illustrates the UPS spectra. The UPS measurements were made on the respective samples without irradiation, with 1-minute irradiation, and with 10-minute irradiation. The photoelectron intensity is normalized using a gentle peak appearing around the binding energy of 6.5 eV. As shown in FIG. 16, the spectra measured on samples with 1-minute irradiation and with 10-minute irradiation both have a clear peak (denoted by (II) in the figure) appearing in the binding energy range from 4.5 eV to 5.4 eV. Such a peak does not appear in the spectrum measured on samples without irradiation. In addition, the respective spectra measured on samples with 1-minute irradiation and with 10-minute irradiation are substantially identical in the shape of the peak. This means that variations in the UPS spectral shape within the binding energy range from 4.5 eV to 5.4 eV substantially converge with the irradiation for the duration of one minute or longer. This behavior is similar to that observed in C1s spectra. In addition, this behavior is assumed to indicate, similarly to C1s spectra, that the adsorbate removal effect is obtained by UV irradiation and that the effect becomes saturated with the irradiation performed for the duration of one minute or longer.

Figure 17:
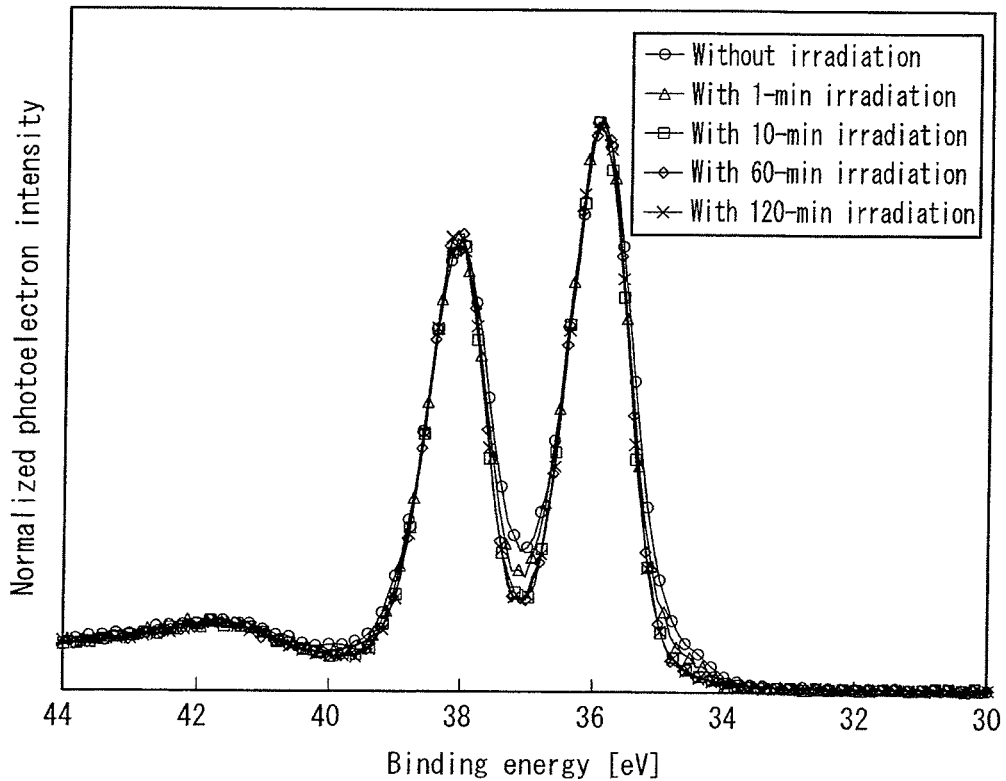
FIG. 17 is a view illustrating XPS spectra of tungsten oxide.

The second one of such a method uses XPS measurements to make a saturation determination based on changes in the W4f spectral shape. FIG. 17 shows W4f spectra measured on the respective samples without irradiation, with 1-minute irradiation, with 10-minute irradiation, with 60-minute irradiation, and with 120-minute irradiation. The spectra are normalized using the maximum and minimum values.

As shown in FIG. 17, all the samples with irradiation exhibit a peak steeper than a peak exhibited by the samples without irradiation (i.e., the half-width of each peak is smaller). It is noted, in addition, that the peak shape is slightly steeper for the samples with 10-minute irradiation than for the samples with 1-minute irradiation. Yet, for the samples with 10-minute irradiation, with 60-minute irradiation, and with 120-minute irradiation, the spectra coincide substantially entirely. This means that changes in the spectral shape converge for any samples with irradiation performed for the duration of ten minutes or longer.

Such changes in shape of W4f spectra resulting from different irradiation durations are explained in the following way, for example. Although it depends on the configuration of adsorbates, provided that the adsorbates supply negative charges to tungsten atoms present on the layer surface, the binding energy of the inner-shell orbital W4f becomes lower according to the negative charges. Chemically speaking, some of hexavalent tungsten atoms present on the layer surface of tungsten oxide change into lower-valent atoms, such as pentavalent atoms. In the XPS spectrum for W4f, this energy level shift is observed as a broader spectral shape because of the spectrum for hexavalent tungsten atoms, which make up the majority, overlaps with the spectrum for lower-valent tungsten atoms, which make up a small proportion.

In view of the above, with respect to the spectra illustrated in FIG. 17, it is assumed that the peak is sharper in shape because the removal of adsorbates by the UV irradiation alters pentavalent tungsten atoms back into hexavalent atoms. Form the above observation, it is understood that most of the adsorbates are removed by the UV irradiation performed for one minute and that the adsorbate removal effect has reached a level of saturation with the UV irradiation performed for ten minutes or longer. This behavior is similar to that observed on C1s.

In addition, although not illustrated in the figure, it is confirmed that the changes in the shape of the spectra for O1s orbital of oxygen atoms converge with the UV irradiation performed for ten minutes or longer.

From the above, the adsorbate removal effect achieved by the UV irradiation according to the present embodiment becomes saturated with the UV irradiation performed for a certain duration or longer. The irradiation conditions are determined as follows. For example, the irradiation duration is determined by measuring, with respect to any specific irradiation intensity, the time taken for changes in the shape of the narrow-scan spectrum for W4f or O1s in XPS measurement converge or changes in the shape of UPS spectral region corresponding to the binding energy range from 4.5 eV to 5.4 eV converge. The time thus measured is determined to be the irradiation duration. More specifically, a spectrum measured after the UV irradiation for n-minute is compared with a spectrum measured after the UV irradiation for (n+1)-minute to obtain the difference between the two spectra at each of a plurality of measurement points. If the root-mean-square of the differences in the normalized intensity becomes equal to a specific value or smaller, it is then determined that the changes in the spectral shape converge with the irradiation duration of n-minutes and thus the maximum level of adsorbate removal has been completed. In this embodiment, it is determined from FIGS. 16 and 17 that the adsorbate removal effect becomes saturated with the UV irradiation performed for ten minutes.

(3) Regarding Maintaining Electronic State after UV Irradiation

According to the present embodiment, the energy level resulting from structures similar to oxygen vacancies, which favorably affect the hole-injection ability, is maintained at least throughout the time from the surface cleaning and until another layer is formed on the cleaned surface. The grounds are as follows.

The UPS spectra shown in FIG. 13 described above were measured two days after the UV irradiation. That is, between the samples without irradiation and the samples with the respective irradiation durations that were left to stand in the atmosphere for two days after the UV irradiation, there is no notable difference in the spectral protrusion near the Fermi surface of the UPS spectra. In each UPS spectrum, the spectral protrusion is clearly observed. In addition, although not illustrated in the figures, measurements were made on samples two hours after the UV irradiation and one day after the UV irradiation. In these measurements, the spectral protrusion near the Fermi surface was clearly observed in each spectrum in a manner similar to FIG. 13. That is to say, it is confirmed that the energy level resulting from structures similar to oxygen vacancies are sustained in the atmosphere at least for two days after the UV irradiation.

This time period of two days is sufficiently long as compared with the time normally lapsed until the step of laminating the buffer layer 6A on the hole injection layer 4 is completed after the step of cleaning the hole injection layer 4 by UV irradiation. That is, unless the step of forming the buffer layer 6A is intentionally delayed, it is unlikely that the buffer layer 6A is not formed until after this two-day period.

(4) Regarding Improvements on EL Element Characteristics by UV Irradiation

The organic EL elements 10*a*, 10*b* and 10*c* according to the present embodiment manufactured using the step of cleaning the hole injection layer 4 by UV irradiation exhibit better characteristics as compared with an organic EL element manufactured without UV irradiation. Such characteristics are confirmed by the following experiments.

Firstly, the inventors prepared hole-only devices as assessment devices to be used in accurately determining the effect on the hole injection efficiency from the hole injection layer 4 to the buffer layer 6A achieved by removing adsorbates from the surface of the hole injection layer 4 by UV irradiation.

Generally, in an organic EL element, electric current is formed of carriers, which consists of holes and electrons. As such, the electrical characteristics of an organic EL element reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

Figure 18:
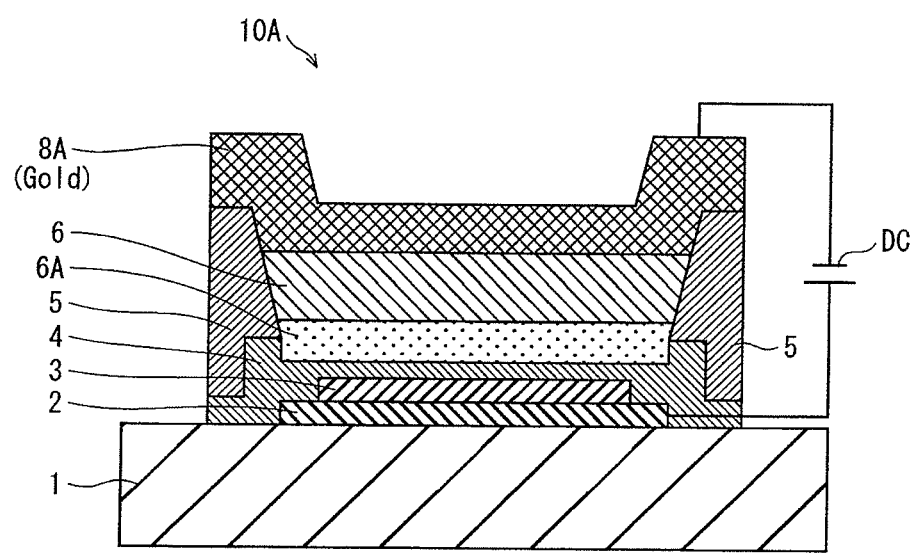
FIG. 18 is a schematic cross-sectional view illustrating a structure of a hole-only device.

In detail, the hole-only devices 10A prepared were actually obtained by replacing the cathode 8 of the organic EL element 10 illustrated in FIG. 4 with gold (Au) to form a cathode 8A as illustrated in FIG. 18. Specifically, by following the manufacturing method of the organic EL element 10 according to the present embodiment, a 50 nm-thick ITO thin film is formed as the anode 2 on the substrate 1 by a sputtering method, as illustrated in FIG. 18. Then, a 30 nm-thick tungsten oxide layer is formed as the hole injection layer 4 on the anode 2, by a predetermined sputtering method in a manner that the layer surface has the energy level resulting from structures similar to oxygen vacancies. Then, a 20 nm-thick layer of TFB, which is an amine-containing organic polymer, is formed as the buffer layer 6A on the hole injection layer 4, and a 70 nm-thick layer of F8BT, which is an organic polymer, is formed as the light-emitting layer 6. Finally, a 100 nm-thick layer of gold is formed as the cathode 8A on the light-emitting layer 6.

Note that two hole-only devices 10A were prepared. One of the hole-only devices 10A had the hole injection layer 4 exposed to the UV light according to the present embodiment (for the irradiation duration of 10 minutes) after the hole injection layer 4 is formed and taken out of the chamber of the sputtering film-forming apparatus. The other of the hole-only devices 10A had the hole injection layer 4 not exposed to UV light. Hereinafter, the former hole-only device 10A is referred to as "HOD with irradiation", whereas the latter hole-only device 10A is referred to as "HOD without irradiation".

Each of the hole-only devices 10A thus prepared was then connected to the direct current voltage source DC, so that voltage was applied thereto. Further, the voltage applied to each sample was changed to measure the values of electric current flowing at different voltages. Each current value is then converted into a value per unit area (current density). Note that hereinafter, a voltage applied to obtain a current density value of 0.4 mA/cm$^2$ is refers to as a "driving voltage".

The hole injection efficiency of the hole injection layer 4 is said to be higher as the driving voltage is smaller, for the following reason. That is, the members composing the hole-only devices 10A, other than the hole injection layer 4, were prepared according to the same manufacturing method. Thus, it could be assumed that the hole injection barrier between two adjacent layers, other than that between the hole injection layer 4 and the buffer layer 6A is uniform in each of the hole-only devices 10A. Considering the above, it could be expected that the differences in driving voltage of the hole-only devices 10A resulting from whether or not the surface of the hole injection layer 4 was exposed to UV light closely reflects the hole injection efficiency from the hole injection layer 4 to the buffer layer 6A.

Table 2 illustrates each of the hole-only devices 10A and a driving voltage thereof.

TABLE 2

| Sample Name | Drive Voltage |
| --- | --- |
| HOD with Irradiation | 18.9 V |
| HOD without Irradiation | 19.7 V |

Figure 19:
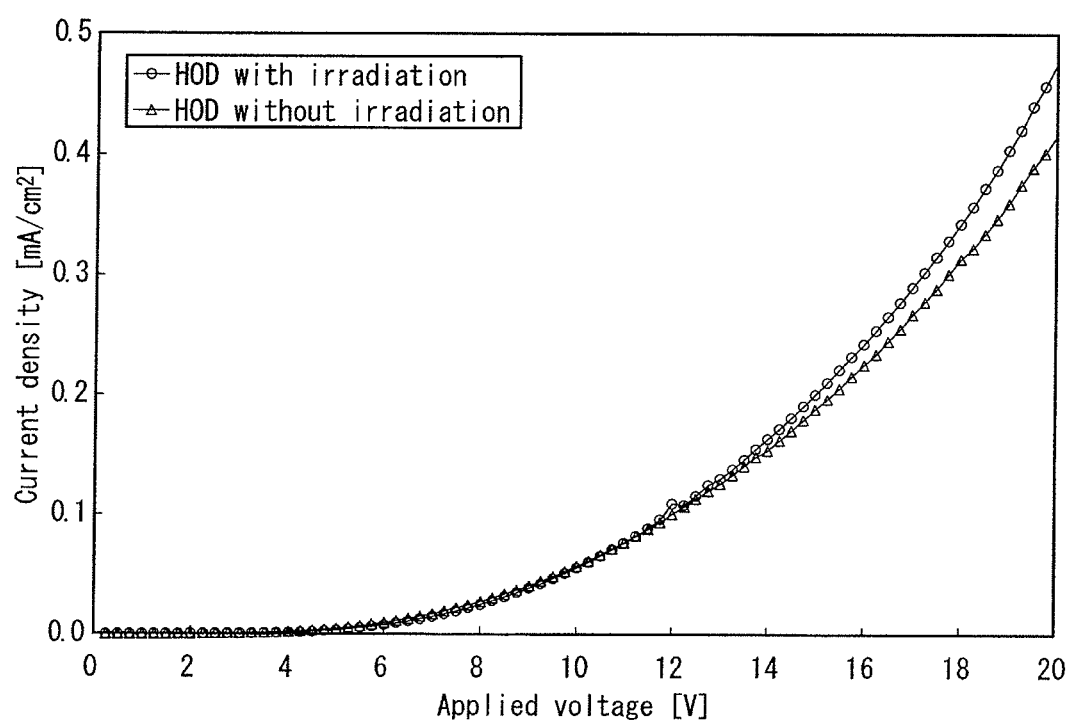
FIG. 19 is a device characteristics diagram of relation curves each illustrating a relation between applied voltage and electric current density of a different hole-only device.

In addition, FIG. 19 illustrates an electric current density-applied voltage curve of each of the hole-only devices 10A. In the figure, the vertical axis indicates electric current density (mA/cm$^2$), whereas the horizontal axis indicates applied voltage (V).

As shown in Table 2 and FIG. 19, when comparing the HOD with irradiation to the HOD without irradiation, the drive voltage is lower and the rising of the electric current density-applied voltage curve is quicker. Further, it could be seen that HOD with irradiation requires for the lowest level of applied voltage to reach a high electric current density compared with HOD without irradiation. That is, HOD with irradiation has a higher degree of hole injection efficiency compared with HOD without irradiation.

In the above, observation has been made of the hole injection efficiency of the hole injection layer 4 in each of the hole-only devices 10A. However, it should be emphasized that the hole-only devices 10A and the organic EL element 10 illustrated in FIG. 4 have nearly the same structure, differing only in the cathode 8A. That is, the organic EL element 10 is essentially the same as hole-only devices 10A in terms of the effect imposed by the adsorbate removal by the UV irradiation on the efficiency of hole injection from the hole injection layer 4 to the buffer layer 6A.

In order as to confirm the above, two samples of organic EL element 10 were prepared. One of the samples were prepared using the hole injection layer 4 exposed to UV light, and the other of the samples were prepared using the hole injection layer 4 not exposed to UV light. Hereinafter, the former sample of the organic EL element 10 is referred to as "BPD with irradiation", whereas the latter is referred to as "BPD without irradiation". Except that the hole injection layer 4 of the BPD without irradiation was not exposed to UV light, the BPDs were manufactured by the manufacturing method according to the present embodiment.

Each sample organic EL apparatus 10 thus prepared was connected to the direct current power source DC, so that voltage was applied thereto. Further, the voltage applied to each sample was changed to measure the values of electric current flowing at different voltages. Each current value is then converted into a value per unit area (current density). Note that hereinafter, the "driving voltage" refers to a voltage applied to obtain the current density value is 1.0 mA/cm$^2$.

Table 3 illustrates each of the sample organic EL elements 10 and a driving voltage thereof.

TABLE 3

| Sample Name | Drive Voltage |
| --- | --- |
| BPD with Irradiation | 8.3 V |
| BPD without Irradiation | 9.2 V |

Figure 20:
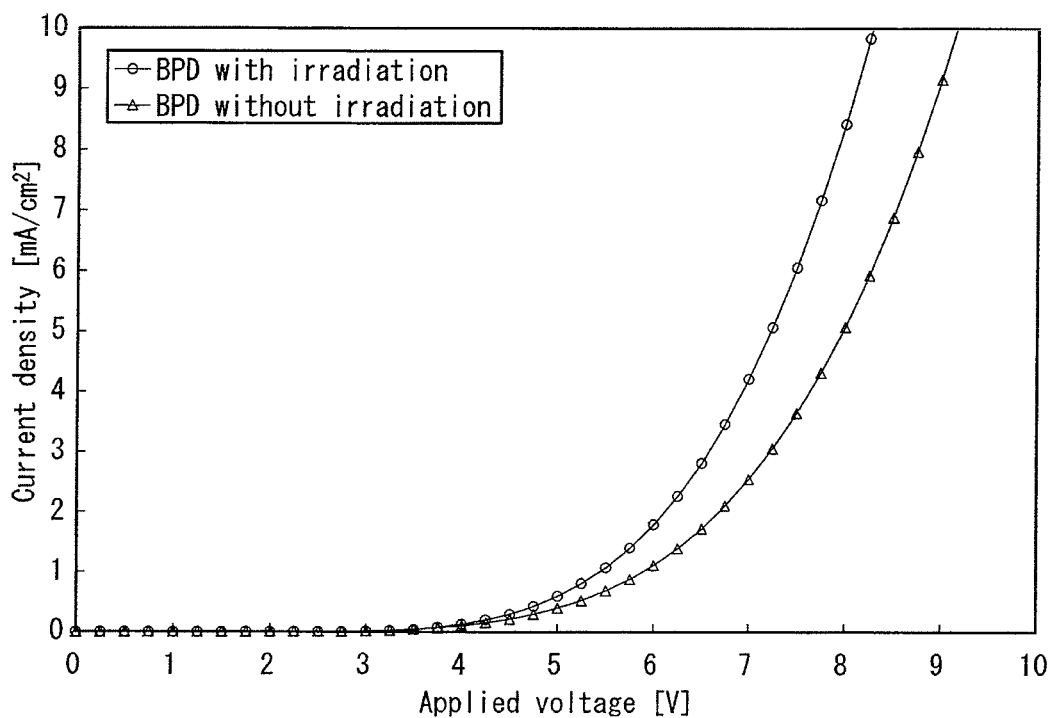
FIG. 20 is a device characteristics diagram of relation curves each illustrating a relation between applied voltage and electric current density of a different organic EL element.

In addition, FIG. 20 illustrates an electric current density-applied voltage curve of each of the sample organic EL elements 10. In the figure, the vertical axis indicates electric current density (mA/cm$^2$), whereas the horizontal axis indicates applied voltage (V).

As shown in Table 3 and FIG. 20, when comparing the BPD with irradiation to the BPD without irradiation, the drive voltage is lower and the rising of the electric current density-applied voltage curve is quicker. Further, it could be seen that BPD with irradiation requires for the lowest level of applied voltage to reach a high electric current density compared with BPD without irradiation. This tendency is the same as that observed with the HOD with irradiation and HOD without irradiation.

By the above experiments, it is confirmed regarding the organic EL element 10 that the effect imposed on the hole injection efficiency from the hole injection layer 4 to the buffer layer 6A as a result of removal of adsorbates by UV irradiation to the surface of the hole injection layer 4 is similar to that confirmed with the hole-only devices 10A.

By the above experiments, the following is confirmed. That is, by UV irradiation performed in a predetermined manner according to the present embodiment after the hole injection layer 4 is formed, adsorbates are removed to the maximum extent from the surface of the hole injection layer 4 without affecting the energy level resulting from structures similar to oxygen vacancies. This means that adsorbates, which are likely to cause increase of the drive voltage and decrease of the life of the organic EL element 10, are removed without impairing the hole injection ability. Consequently, the efficiency in injecting holes from the hole injection layer 4 to the buffer layer 6A is improved, so that excellent characteristics of the organic EL element is realized.

(5) Regarding Wavelength of Ultraviolet Light

According to the present embodiment, after the hole injection layer 4 is formed, adsorbates on the hole injection layer 4 is removed by irradiation of ultraviolet light of a predetermined wavelength in the atmosphere. An organic EL element 10 having the hole injection layer 4 having been subjected to the adsorbates removal operates on a lower drive voltage than an organic EL element manufactured without removal of adsorbates. The wavelength of ultraviolet light was determined through the following observations.

First, the wavelength of ultraviolet light that generates ozone ($O_3$) in a gas atmosphere containing oxygen molecules ($O_2$), such as in the atmosphere is 184.9 nm. By the following reaction, the oxygen molecules are decomposed by ultraviolet light at 184.9 nm to yield oxygen radicals, which are then combined with remaining oxygen molecule to generate ozone.

$$O_2 \rightarrow O + O$$

$$O + O_2 \rightarrow O_3$$

In addition, the wavelength of ultraviolet light causing further decomposition of ozone to yield oxygen radicals again is 253.7 nm.

In UV ozone cleaning, ultraviolet light at 184.9 nm and 253.7 nm is employed to generate oxygen radicals and their strong oxidation is used to remove adsorbates. Therefore, as observed in by the experiment where the hole injection layer 4 was subjected to UV ozone cleaning, there is a risk of the energy level resulting from oxygen vacancies or similar structures disappearing almost completely when ultraviolet light having such wavelengths are used.

In view of the above risk, the present embodiment uses ultraviolet light in a wavelength region of 184.9 nm or longer as such ultraviolet light is not likely to cause decomposition of oxygen molecules to yield oxygen radicals. In addition, in order so as to avoid oxygen radicals from being generated by decomposition of ozone present at an extremely small amount in the atmosphere, it is further preferable to use ultraviolet light within a wavelength region of 253.7 nm or longer.

Figure 21:
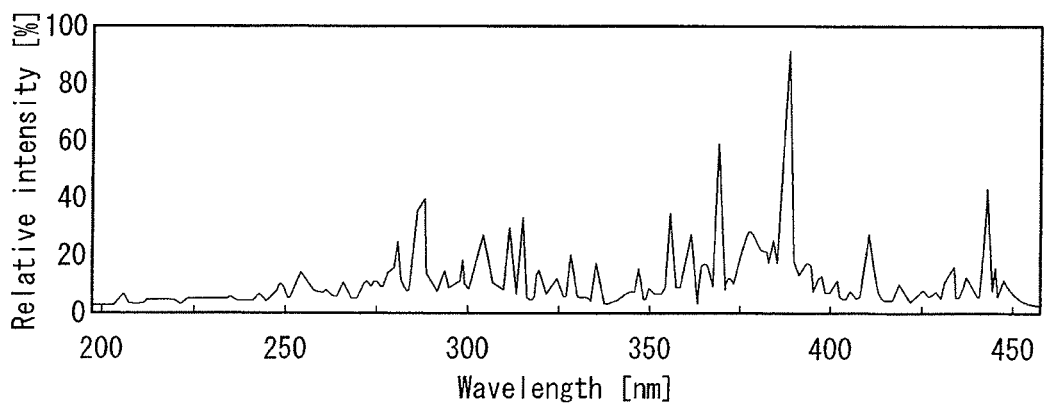
FIG. 21 is a view illustrating the spectral distribution of a metal halide lamp employed in an embodiment of the present invention.

The metal halide lamp actually used in the present embodiment has a spectral distribution illustrated in FIG. 21. As illustrated in the figure, the present embodiment uses a lamp that emits light of wavelengths of 253.7 nm or shorter as little as possible. In light emitted by the metal halide lamp, the intensity at 253.7 nm or shorter is at most a few percent of the maximum intensity (at about 380 nm).

Next, the binding energies between different combinations of atoms that may present in typical adsorbates are shown in Table 4. In the table, the mark "=" indicates double bond, whereas the mark "—" indicates single bond. To remove adsorbates, first, it is required to irradiate the layer surface with light having energy stronger than the bonding energies to break the bonds.

TABLE 4

| Binding | Binding Energy |
|---|---|
| C=C | 607 |
| C—C | 348 |
| C=O | 724 |
| C—O | 352 |
| C—H | 413 |
| O=O | 490 |
| O—O | 139 |
| O—H | 463 |

Note that the light energy E per mol of photons and the wavelength λ are in the inverse proportion shown below.

$E = Nhc/\lambda$ (N: Avogadro's number, h: Planck's constant, c: velocity of light, and λ: wavelength)

From the above expression, the energy of ultraviolet light at the wavelength 184.9 nm is calculated to be 647 kJ/mol. Similarly, the energy of ultraviolet light at the wavelength 253.7 nm is calculated to be 472 kJ/mol. With reference to Table 4, the energy value of the ultraviolet light in the wavelength region determined according to the present embodiment is sufficient to disconnect most of atomic bonds typically appearing in adsorbates. Especially, as will be later described in detail, in the case of chemical adsorption, adsorbates mainly make single bonds to oxygen atoms present in tungsten oxide. The strongest singe bond with atoms present in adsorbates is O—H bond with the bonding energy of 463 kJ/mol (corresponding to wavelength of 258 nm) or so. Therefore, the ultraviolet light within the wavelength region of the present embodiment is strong enough to break the chemical bond. In the case of physical adsorption, the bonding is far weaker than chemical adsorption, so that such adsorbates are readily removed by UV irradiation.

The above describes the reason why the ultraviolet light used in the present embodiment is sufficient to remove adsorbates.

Indeed, the efficiency of adsorbate removal by the UV radiation according to the present embodiment is essentially lower than UV ozone cleaning. This is because the UV ozone cleaning ensures that adsorbates being unbonded are immediately oxidized with oxygen radicals to form molecules such as $CO_2$ and $H_2O$, which easily migrate. As has been already described, however, UV ozone cleaning is not suitable for cleaning the hole injection layer 4 composed of tungsten oxide.

To be noted next is that atomic bonds occurring in tungsten oxide is not generally broken by the energy of ultraviolet light within the wavelength region according to the present embodiment. According to Non-Patent Literature 3, for example, the binding energy between oxygen atom and tungsten atom in tungsten oxide is 672 kJ/mol (corresponding to the wavelength of 178 nm). That is, it is difficult to break the bond between oxygen atom and tungsten atom with ultraviolet light within the wavelength region according to the present embodiment. This is in contrast with the above-described sputter etching performed in vacuum by using argon ion. That is, with the use of ultraviolet light according to the present embodiment, adsorbates are removed without breaking atomic bonds present in the hole injection layer 4 composed of tungsten oxide. That is, adsorbates are removed without making the hole injection layer 4 chemically active, i.e., while the hole injection layer 4 is chemically stable.

For the reasons described above, the present invention uses ultraviolet light at the wavelength of 184.9 nm or longer, preferably 253.7 nm or longer. Note that visible light is generally incapable of breaking the bond of chemical adsorption. The present embodiment therefore uses ultraviolet light (380 nm or shorter), rather than visible light.

(6) Reason for which Energy Level Affecting Hole Injection Ability is Maintained after UV Irradiation According to the present embodiment, the energy level resulting from structures similar to oxygen vacancies on the surface of the hole injection layer 4 is continuously maintained even after UV irradiation and thus the hole injection ability is maintained with stability. That is, the present embodiment ensures manufacturing of organic EL elements which operate on low drive voltage. This property of maintaining the energy level is considered below.

It has been frequently reported, with reference to results of experiments and first principles calculations, that existence of the energy level which can be seen in a thin film of, or a crystal of tungsten oxide, derives from structures similar to oxygen vacancies. More specifically, assumption has been made that the existence of the occupied energy level near the Fermi surface derives from a binding orbital formed by 5d orbitals of adjacent tungsten atoms or from a 5d orbital of a singular tungsten atom which is not terminated with an oxygen atom and which exists at the surface of a film or within a film.

Here, it may be assumed that 5d orbitals of tungsten atoms are more stable when adsorbates are chemically adsorbed thereto, as compared with the case where the 5d orbitals are present as bonding orbitals or as the 5d orbitals of singular tungsten atoms. However, such an assumption is not necessarily correct. Actually, as observed in the UPS spectra illustrated in FIG. 13, tungsten oxide left to stand in the atmosphere for two day exhibits a spectral protrusion near the Fermi surface, which is the indication of the energy level being discussed.

Figure 22:
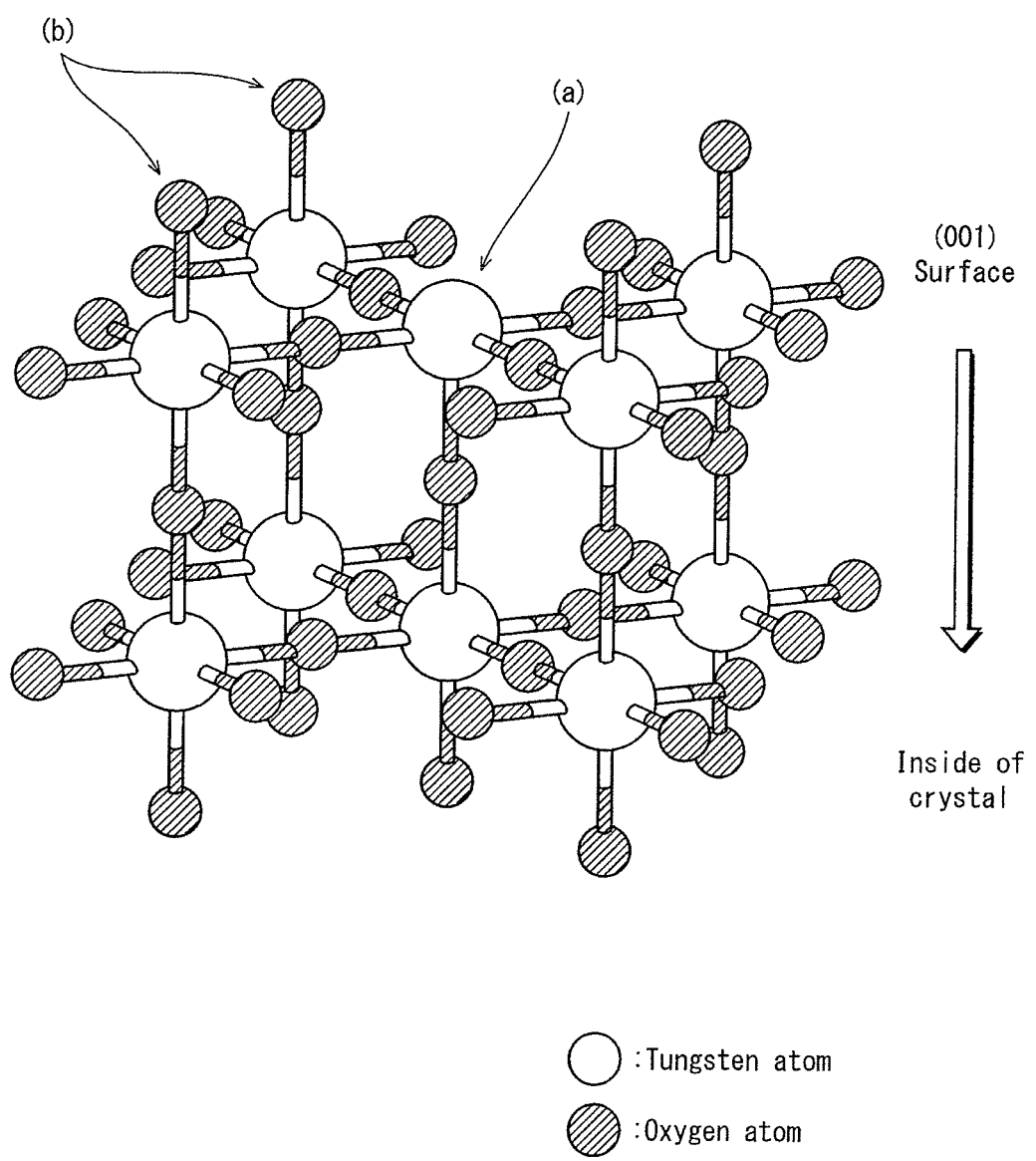
FIG. 22 is a view illustrating the surface configuration of tungsten oxide.

In Non-Patent Literature 4, it has been reported that when tungsten trioxide single crystal is cleaved in vacuum to expose the clean (001) surface, part of oxygen atoms present on the outermost surface are emitted. Non-Patent Literature 4 further reports the following reason, which has been confirmed by the first principles calculations, for which the (001) surface is more stable in terms of energy when a tungsten atom not terminated with an oxygen atom is periodically present on the outermost surface as shown in FIG. 22 than when all the tungsten atoms are terminated with an oxygen atom. That is, when all the tungsten atoms present on the outermost surface are terminated with an oxygen atom, the electrical repulsive force occurring between terminal oxygen atoms becomes large, which causes the instability. In short, the (001) surface is more stable when structures similar to oxygen vacancies (a) are present on the surface.

FIG. 14 illustrates tungsten oxide atoms each surrounded by six oxygen atoms to form an octahedron with the six oxygen atoms at the vertices. For the simplicity sake, in the figure, the octahedrons are arranged in orderly succession in a manner similar to the rhenium oxide structure. In practice, however, the octahedrons are distorted to some extent and arranged without such orderliness.

By analogy with the above findings, the following mechanism may be one example of the reason for which the energy level resulting from structures similar to oxygen vacancies is maintained on the surface of the hole injection layer 4 continuously after the UV irradiation according to the present embodiment.

According to the present invention, the hole injection layer 4 composed of tungsten oxide is assumed to have a (001) facet at least locally on the layer surface immediately after the formation of the hole injection layer 4. That is, as illustrated in FIG. 22, the hole injection layer 4 is assumed to have terminal oxygen atoms (b) and tungsten atoms not terminated with an oxygen atom (a). Non-terminated tungsten atoms (a) are surrounded by terminal oxygen atoms (b). It is because the (001) surface has a stable structure. It is this surface that is exposed to impurity molecules and atomic molecules in the chamber of the sputtering film-forming apparatus subsequently to the formation of the hole injection layer 4.

In general, if unsaturated metal atoms such as (a) are present on the layer surface of metal oxide, the metal atoms tend to be terminated with a water or organic molecule as a result of chemical adsorption. In the present embodiment, however, none of the W4f spectra illustrated in FIG. 17 have a peak in a binding energy range from 31 eV to 33 eV at which a peak derived from the bonding between a tungsten atom and a carbon atom should appear. Instead, each W4f spectra illustrated in FIG. 17 has a peak derived from the bonding between a tungsten atom and an oxygen atom. It is therefore highly likely that the atoms of adsorbed molecules to which tungsten atoms (a) are chemically bonded is oxygen atoms.

However, for example, a tungsten atom (a) may chemically react with a water molecule to form a hydroxyl group or a tungsten atom (a) may chemically react with an organic molecule to be bonded to an oxygen atom contained in the organic molecule. In such cases, a repulsive force is generated between an adsorbed oxygen atom, which generally is in negatively charged, and adjacent terminal oxygen atoms (a), which are also negatively charged. In view of the above, it is expected that adsorption of molecules to tungsten atoms (a) is relatively unlikely, for the same reason for which tungsten atoms (a) are unlikely to have terminal oxygen atoms in vacuum.

On the other hand, terminal oxygen atoms (b) surrounding tungsten atoms (a) undergo addition reaction with water molecules and organic molecules to cause chemical adsorption. Such chemical adsorption occurs relatively easily as there is substantially no factor inhibiting adsorption, such as repulsive force. In some cases, the chemical adsorption to terminal oxygen atoms (b) may result in that organic molecules composed of a few or more atoms are present in the immediate vicinity of tungsten atoms (a). Such organic molecules act as spatial barriers to against adsorbing molecules. Therefore, adsorption of molecules to terminal oxygen atoms (b) is also expected to prevent adsorption of molecules to tungsten atoms (a).

From the above consideration, in the layer surface having: terminal oxygen atoms (b); and tungsten atoms (a) not terminated with an oxygen atom and surrounded by the terminal oxygen atoms (b) as illustrated in FIG. 22, the occurrence of chemical adsorption to the tungsten atoms (a) is less likely. Instead, impurity molecules and atomic molecules tend to chemically adhere to the terminal oxygen atoms (b) surrounding tungsten atoms (a). Note that the chemical adsorption occurring in this case is a bond via a terminal oxygen atom and thus generally is a single bond.

In response to the UV irradiation according to the present embodiment, only molecules chemically bonded to oxygen atoms (b) are disconnected and released. As a result, it is expected that the oxygen atoms (b) revert to terminal oxygen atoms as they were before the chemical adsorption or react with water molecules to form hydroxyl groups, which are stable and not easily disconnected by the UV irradiation according to the present embodiment.

To summarize the above, the hole injection layer 4 composed of tungsten oxide according to the present embodiment has, on the layer surface, the local structure as illustrated in FIG. 22. That is, tungsten atoms (a) not terminated with an oxygen atom are surrounded by terminal oxygen atoms (b). First of all, this structure per se has a characteristic which prevents adsorption of molecules. In addition, molecules adhered to terminal oxygen atoms (b) are released by UV irradiation, after which hydroxyl groups mainly remain present on the layer surface. In this manner, while adsorbates are removed by UV radiation performed after the layer formation, the electronic state resulting from structures similar to oxygen vacancies (a) on the layer surface is maintained without being affected by the UV irradiation. The electron state thus maintained positively affects the hole injection ability.

(7) Regarding Film Loss of the Hole Injection Layer

In manufacturing process of the organic EL element having the hole injection layer containing tungsten oxide, the inventors of the present invention have found out that the thickness of the hole injection layer has decreased (the reduction in the thickness of the hole injection layer is referred to hereinafter as "film loss"). The inventors made an assumption that this film loss of the hole injection layer takes place during the processing of forming the banks. Based on such an assumption, the inventors conducted a confirmation experiment as described in the following so as to investigate the cause of the film loss of the hole injection layer.

During the experiment, various samples were prepared using the following steps, and film density and the amount of film loss were measured for each sample. To be specific, a thin film made of tungsten oxide was prepared by forming a film composed of tungsten oxide, which is to become the hole injection layer, on a glass substrate by sputtering (this film was formed under the same film forming conditions as that of the hole-only device 10A). Subsequently, the inventors formed a resin material layer composed of a predetermined resin material ("TFR" series resin material produced by Tokyo Ohka Kogyo Co., Ltd.) so as to be layered on the hole injection layer of each sample by applying the spin coating method (room temperature, 2500 rpm/25 sec) and by performing baking (100° C., 90 sec). Following this, development processing (where a solution including 2.38% TMAH was used and where the developing time was 60 sec) and cleaning processing (where pure water was used and where the cleaning time was 60 sec) were performed. Successively, the resin material layer having been layered on the hole injection layer was removed. The forming of the resin material layer, the development processing, and the cleaning processing were performed so as to simulate the actual process of forming the banks.

Table 5 indicates sample preparing conditions, and the results of the measurement of an amount of film loss and film density. As shown in Table 5, film loss of the hole injection layer was confirmed for each sample. For example, the film loss of the hole injection layer in sample A, which was 80 nm at a point immediately following the forming thereof, decreased to 23 nm by the end of the experiment. As such, it was observed that the film thickness of the hole injection layer in sample A decreased by as much as approximately 57 nm due to occurrence of the film loss.

TABLE 5

| Sample Device | Sample A | Sample B | Sample C |
| --- | --- | --- | --- |
| Total Pressure (Pa) | 4.8 | 2.7 | 2.7 |
| Ar:$O_2$ | 100:100 | 43:100 | 43:100 |
| Input Power (W) | 250 | 500 | 1000 |
| Film Density (g/cm$^3$) | 5.43 | 6.09 | 6.33 |
| Film Loss (nm) | 57.7 | 25 | 20.9 |
| Notes/Film-Forming Apparatus | SMD | SOLCIET | SOLCIET |

The inventors of the present invention inquired into the causes of film loss of the hole injection layer, and ascertained that the hole injection layer is dissolved by dissolution liquid used in development or cleaning, so that the film loss of the hole injection layer occurs. The film density of the hole injection layer having the structures with oxygen vacancies is low. Presumably, this is because a number of fine crystal structures are formed in the hole injection layer. It could be assumed that due to a number of fine crystal structures thus formed, the dissolution liquid (a developing solution, a cleaning liquid, etc.) used in the process of forming the banks easily permeates the hole injection layer, thereby causing film loss.

Figure 23:
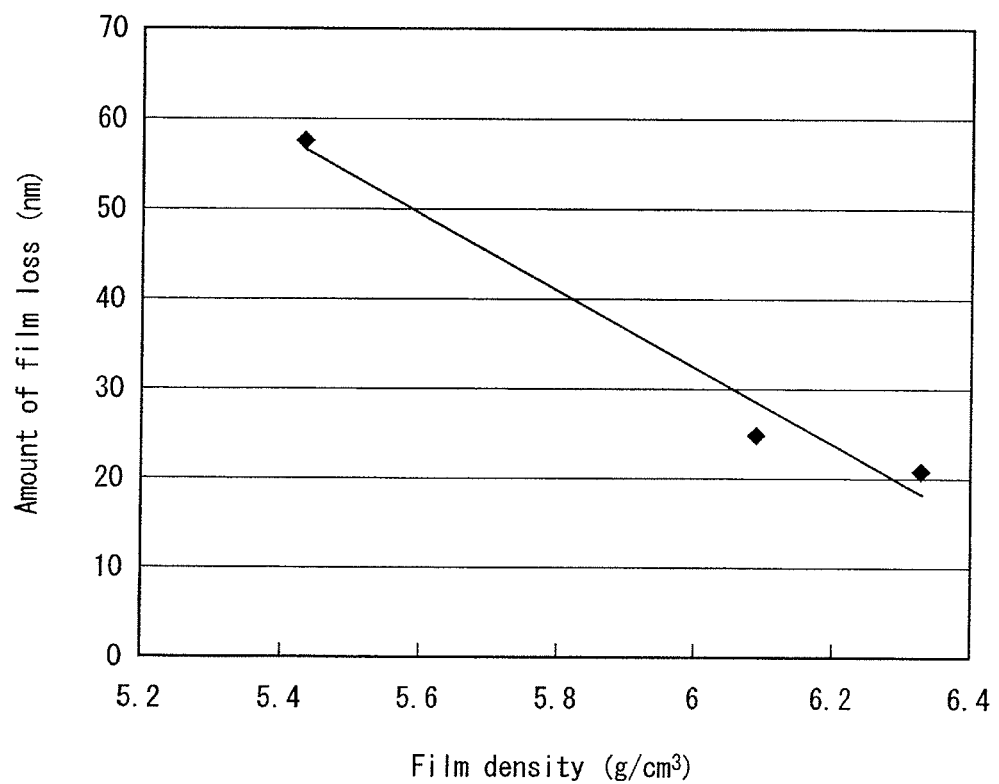
FIG. 23 is a graph showing a relation between an amount of film loss and film density of tungsten oxide film.

FIG. 23 is a graph showing a relation between an amount of film loss and film density of the hole injection layer. The results of the measurement shown in Table 5 may be summarized as follows. As demonstrated in FIG. 23, there was a considerable level of correlation between an amount of a hole injection layer decreasing as a result of the film loss and a film density of the hole injection layer. More specifically, when a hole injection layer had a relatively low film density, the amount of film loss of the hole injection layer indicated a relatively great value. According to the assumption of the inventors of the present invention, while the hole injection layer with structures with oxygen vacancies has excellent hole injection properties that enable the organic EL element to be driven at a low voltage, the dissolution liquid (a developing solution, a cleaning liquid, etc.) used in the process of forming the banks easily permeates the hole injection layer due to the structures with oxygen vacancies of the hole injection layer, thereby greater film loss occurs.

In general, there is a concern that the above-mentioned film loss might make it difficult to manage the thickness of the tungsten oxide film and have some effect on hole injection properties of the tungsten oxide film of the completed organic EL element. Hence, if people skilled in the art are aware of the occurrence of such film loss of the hole injection layer, it is assumed that they will hesitate to form the hole injection layer by using tungsten oxide.

Intensive studies by the inventors of the present invention on this problem, however, have revealed that the film loss of the tungsten oxide film can be adjusted by appropriately changing developing conditions (i.e., by reducing concentration of developer from 2.38% to approximately 0.2%) or baking conditions, for example. According to this, the thickness of the tungsten oxide film can be controlled while taking the loss of the tungsten oxide film into account. Furthermore, the inventors of the present invention performed a study on an experimental model of a more realistic organic EL element based on such a technology of controlling an amount of film loss of the hole injection layer, and confirmed the following technical matters.

The steps of manufacturing of the experimental model of the organic EL element were first to form a hole injection layer composed of tungsten oxide on an anode, and then to form a bank material layer on the hole injection layer. Subsequently, the bank material layer was patterned in a predetermined shape having an aperture in which functional layer was to be formed (during patterning, banks are exposed, developed and cleaned). Subsequently, the functional layer was formed at a position corresponding to the aperture, and a cathode was formed on the functional layer.

When the inventors of the present invention examined the organic EL element manufactured in this method, the inventors found that tungsten oxide was dissolved to become a concavity at a position corresponding to the aperture of the hole injection layer, and accordingly, the hole injection layer, as a whole, was configured to have concave structures.

Here, focusing on a corner surrounded by an inner bottom surface and an inner side surface of the recess of the hole injection layer, the inventors gained the following knowledge. By applying ink material constituting the functional layer to an inner surface including the corner of the recess, the wettability of the functional layer improves, and excellent functional layer will be formed.

As such, the present inventors have come to an idea of forming the surface of the functional layer to have the concave structure, as well as causing the inner surface of the recess in the concave structure to be in contact with the functional layer in an area defined by the banks, as shown in the above embodiment.

(8) Concentration of Charges in the Vicinity of the Upper Peripheral Edge of the Recess Regarding the organic EL element to which the metal compound is applied as described in the section of Background Art, the inventor found, through an intense study, that the uneven luminance can occur in the light-emitting surface and a life of the organic EL element can be reduced due to localized deterioration of the light-emitting layer.

After further studying these problems, the inventor gained the following knowledge.

Figure 24A:
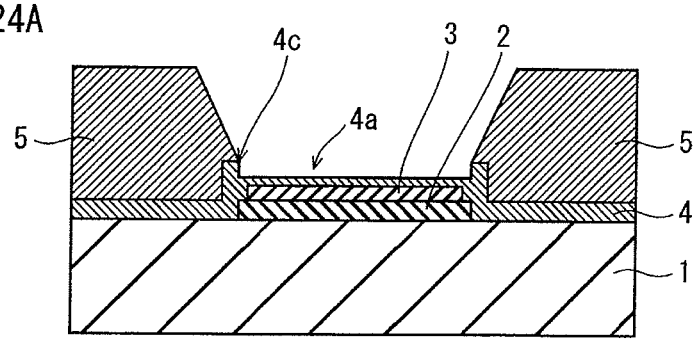
FIGS. 24A and 24B explain concentration of charges in the vicinity of an upper peripheral edge of a recess.
Figure 24B:
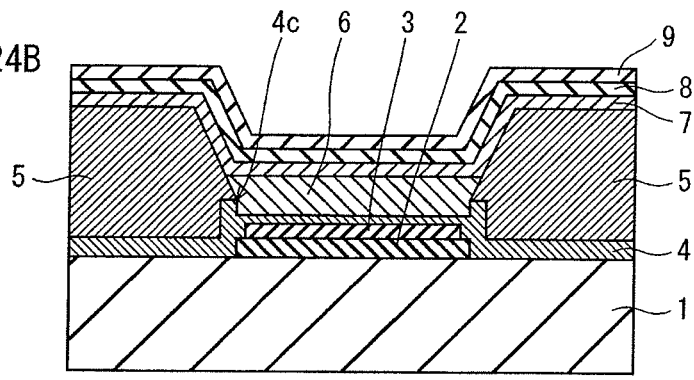

FIGS. 24A and 24B explain concentration of charges in the vicinity of an upper peripheral edge of a recess. Each of FIGS. 24A and 24B shows manufacturing process of an organic EL display. FIG. 24A shows a status in which the anode 2, the ITO layer 3, the hole injection layer 4, and the bank 5 are formed on a TFT substrate 1. FIG. 24B shows a status in which the light-emitting layer 6, the electron injection layer 7, the cathode 8, and the passivation layer 9 are formed in addition to the components shown in FIG. 24A.

With the structure in which the metal compound is applied to the charge injection transport layer (the hole injection layer 4 in this example), a recess 4a is formed in an upper surface of the hole injection layer 4 (see FIG. 24A) in a process of forming the bank 5. If the light-emitting layer 6 is formed with the recess 4a formed in the upper surface of the hole injection layer 4 (see FIG. 24B), an electric field concentrates in the vicinity of an upper peripheral edge 4c of the recess 4a when the organic EL display emits light. As a result, localized flow of current can occur in the light-emitting layer 6. This might lead to the occurrence of uneven luminance in a light-emitting surface and reduce a life of the organic EL element due to localized deterioration of the light-emitting layer.

The above-described problems and knowledge are unique to an organic EL element to which tungsten oxide is applied, and have technical significance in terms of not having been revealed.

As described above, the inventor arrived at the following technical features through a series of research and studies. That is, by covering the upper peripheral edge of the recess formed in the upper surface of the hole injection layer with a part of the bank, concentration of charges in the vicinity of the upper peripheral edge of the recess is suppressed when an organic EL element emits light. As a result, localized flow of current is suppressed.

<Display Apparatus>

Figure 25:
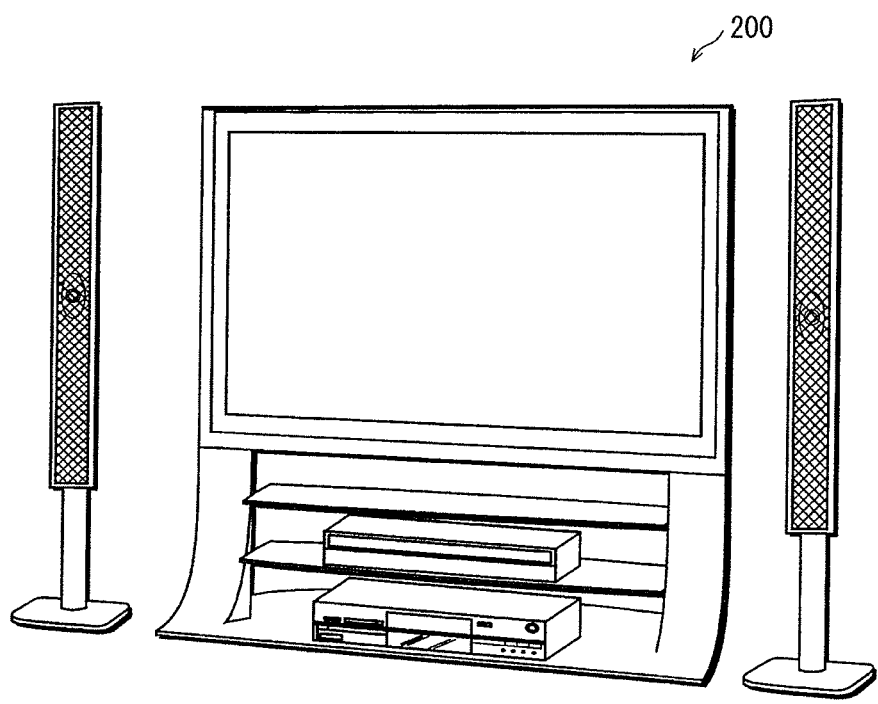
FIG. 25 is a perspective view showing apparatuses such as a display apparatus pertaining to one aspect of the present invention.

FIG. 25 is a perspective view showing apparatuses such as a display apparatus pertaining to one aspect of the present invention. As FIG. 25 shows, a display apparatus 300 pertaining to one aspect of the present invention is an organic EL display formed by a plurality of pixels arranged in a matrix. Each pixel emits a color corresponding to one of R (red), G (green), or B (blue) and composed of a light-emitting element pertaining to one aspect of the present invention.

Figure 26:
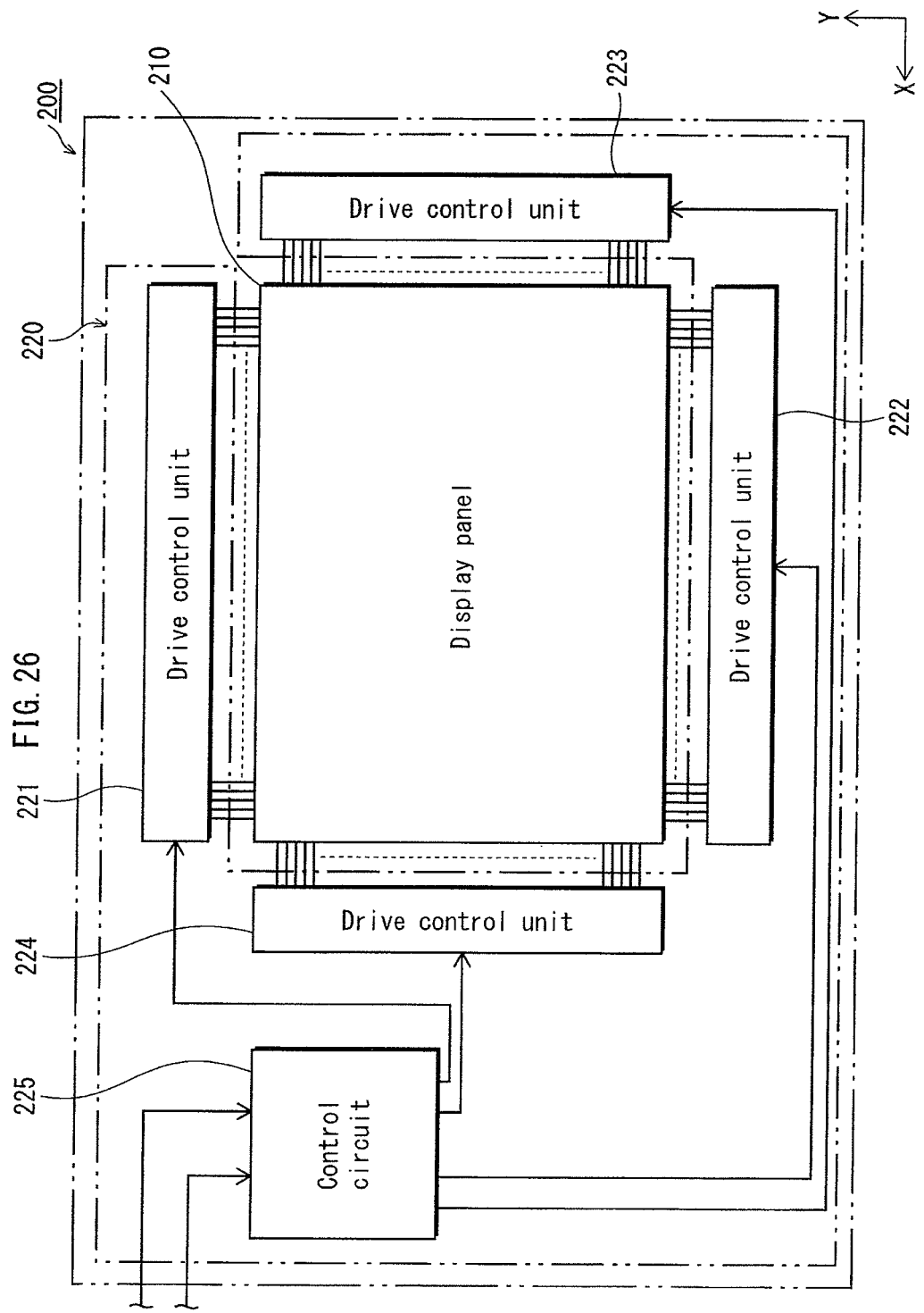
FIG. 26 is a view illustrating an overall structure of a display apparatus pertaining to one aspect of the present invention.

FIG. 26 is a view illustrating an overall structure of a display apparatus pertaining to one aspect of the present invention. As illustrated in FIG. 26, the display apparatus 300 includes a display panel 310 having organic EL elements manufactured by the method according to one aspect of the present invention and also includes a drive control unit 320 connected to the display panel 310. The display apparatus 300 may be used, for example, in a display, television, and mobile phone. The drive control unit 320 includes four drive circuits 321-324 and a control circuit 325. However, in an actual display apparatus 300, the arrangement and connection of the drive control unit 320 with respect to the display panel 310 is not limited to as described above.

The display apparatus 300 having the above structure is excellent in its image quality owing to the excellent light-emitting characteristics of the organic EL elements. Note that the specific embodiment(s) described above is an example used in order to clearly illustrate a structure of the present invention and the effects and advantages thereof. The present invention is not limited to the specific embodiment described above.

<Light-emitting Apparatus>

Figure 27A:
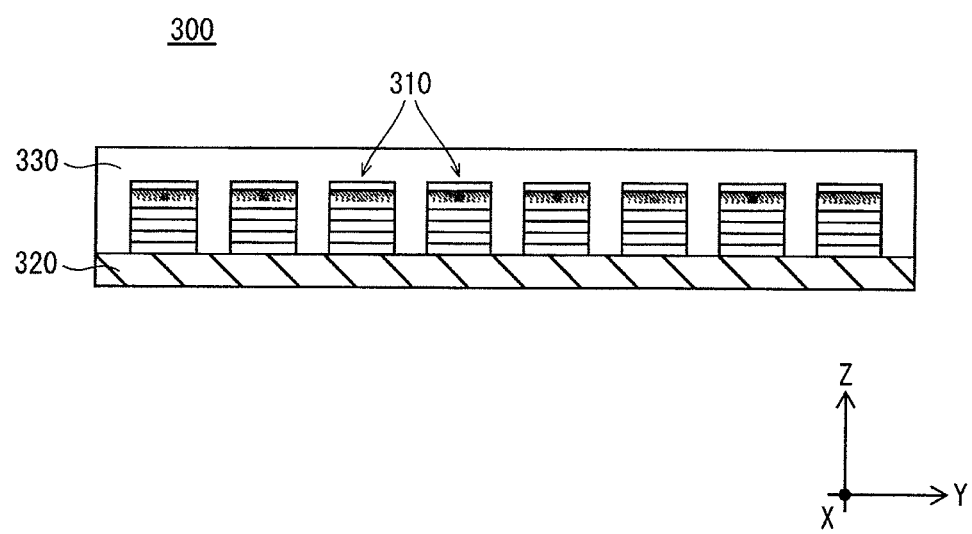
FIG. 27A is a longitudinal sectional view illustrating a light-emitting apparatus according to one aspect of the present invention.
Figure 27B:
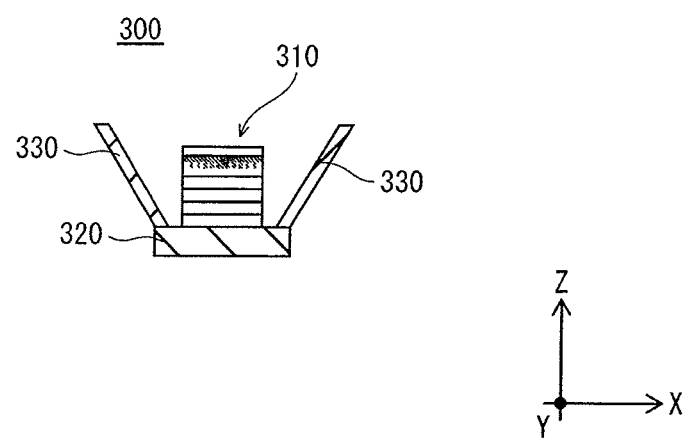
FIG. 27B is a transverse sectional view illustrating the light-emitting apparatus.

FIGS. 27A and 27B illustrate a light-emitting apparatus according to one aspect of the present invention. More specifically, FIG. 27A is a longitudinal sectional view, whereas FIG. 27B is a transverse sectional view. As shown in FIGS. 27A and 27B, the light-emitting apparatus 400 includes: organic EL elements 410 manufactured by the method according to the aspect of the present invention; a base 420 having the organic EL elements 410 mounted on its upper surface; and a pair of reflecting members 430 disposed to flank an array of the organic EL elements 410. The light-emitting apparatus 400 may be used as an illuminator and a light source. The organic EL elements 410 are electrically connected to a conductive pattern (not illustrated) formed on the base 420 and emit light on power supplied via the conductive pattern. Part of light emitted from the organic EL elements 410 is reflected by the reflecting members 430, whereby the light distribution is controlled.

The display apparatus 400 having the above structure is excellent in its image quality owing to the excellent light-emitting characteristics of the organic EL elements. Note that the specific embodiment(s) described above is an example used in order to clearly illustrate a structure of the present invention and the effects and advantages thereof. The present invention is not limited to the specific embodiment described above.

INDUSTRIAL APPLICABILITY

The organic EL element pertaining to the present invention is to be used as display elements for mobile phone displays and TVs, and as a light source for various applications. Regardless of the specific use thereof, the organic EL element of the present invention is applicable as an organic EL element having a wide range of luminous intensity from high to low, and which can be driven at a low voltage. Especially, the high luminescence renders the present invention applicable as a light source and the like. The organic EL element of the present invention, for having such a high level of performance, may be used in a wide range of applications, including those for household use, those for use in public facilities, and those for professional use. More specifically, such applications include: various display apparatuses; TV apparatuses; displays for portable electronic devices; illumination light sources, and etc.

REFERENCE SIGNS LIST 2 anode
4 hole injection layer 4a recess
4b bottom of recess
4c upper peripheral edge of recess
4d inner side surface of recess
5 bank
5a, 5b bottom surface of bank
5d covering part
6 light-emitting layer
8 cathode
10 organic EL element
300 display apparatus
400 light-emitting apparatus

The invention claimed is:

1. An organic electroluminescent (EL) element, comprising:
   an anode;
   a cathode;
   a functional layer disposed between the anode and the cathode, and including a light-emitting layer made of organic material;
   a hole injection layer disposed between the anode and the functional layer; and
   a bank that defines an area in which the light-emitting layer is to be formed, wherein
   the hole injection layer contains a tungsten oxide,
   an Ultraviolet Photoelectron Spectroscopy (UPS) spectrum, obtained from a UPS measurement, has a protrusion appearing near a Fermi surface and within a region corresponding to a binding energy range lower than a top of a valence band,
   the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed 0.83,
   an inner portion of the hole injection layer is depressed to define a recess,
   an upper peripheral edge of the recess is covered with a part of the bank, the upper peripheral edge of the recess comprising at least a portion of an inner side surface of the recess,
   the UPS measurement includes parameters comprising He I as a light source and a normal line direction to a surface of the substrate as an electron emission angle, and
   the XPS measurement includes parameters comprising Al Kα as the light source and the normal line direction to the surface of the substrate as the electron emission angle.

2. The organic EL element according to claim 1, wherein in the UPS spectrum, the protrusion appears within the region corresponding to the binding energy range from 1.8 eV to 3.6 eV lower than the top of the valance band.

3. The organic EL element according to claim 1, wherein the ratio in the number density of the other atoms to the tungsten atoms does not exceed 0.62.

4. The organic EL element according to claim 1, wherein the atoms other than tungsten atoms and oxygen atoms comprise carbon atoms.

5. The organic EL element according to claim 1, wherein the hole injection layer is irradiated with ultraviolet light so that
   the hole injection layer in the UPS spectrum obtained from the UPS measurement has the protrusion appearing near the Fermi surface and within the region corresponding to the binding energy range lower than the top of a valence band, and
   the tungsten oxide contained in the hole injection layer satisfies the condition, as determined by the XPS measurement, that the ratio in the number density of atoms other than tungsten atoms and oxygen atoms to the tungsten atoms does not exceed 0.83.

6. The organic EL element according to claim 1, wherein the part of the bank reaches a bottom of the recess of the hole injection layer, and a side surface of the bank slopes upward from the bottom of the recess to a top of the bank.

7. The organic EL element according to claim 1, wherein the part of the bank is out of contact with a bottom of the recess.

8. The organic EL element according to claim 1, wherein the hole injection layer extends laterally along a bottom surface of the bank.

9. The organic EL element according to claim 1, wherein the upper peripheral edge of the recess is a convex portion composed of (i) a part of the upper surface of the hole injection layer in which the recess is not formed and (ii) the inner side surface of the recess.

10. An organic electroluminescent (EL) element, comprising:
    an anode;
    a cathode;
    a functional layer disposed between the anode and the cathode, and including a light-emitting layer made of organic material;
    a hole injection layer disposed between the anode and the functional layer; and a bank that defines an area in which the light-emitting layer is to be formed, wherein
    the hole injection layer contains a tungsten oxide, an Ultraviolet Photoelectron Spectroscopy (UPS) spectrum, obtained from an UPS measurement having:
    a protrusion appearing near a Fermi surface and within a region corresponding to a binding energy range lower than a top of a valence band, and
    a peak appearing within a another region corresponding to a binding energy range from 4.5 eV to 5.4 eV,
    an inner portion of the hole injection layer is depressed to define a recess, and
    an upper peripheral edge of the recess is covered with a part of the bank, the upper peripheral edge of the recess comprising at least a portion of an inner side surface of the recess, and
    the UPS measurement includes parameters comprising He I as a light source and a normal line direction to a surface of the substrate as an electron emission angle.

11. The organic EL element according to claim 10, wherein in the UPS spectrum, the protrusion appears within the region corresponding to the binding energy range from 1.8 eV to 3.6 eV lower than the top of the valance band.

12. The organic EL element according to claim 10, wherein the hole injection layer is irradiated with ultraviolet light so that
    the hole injection layer, in the UPS spectrum, obtained by the UPS measurement,
    has the protrusion appearing near the Fermi surface and within the region corresponding to the binding energy range lower than the top of the valence band, and
    the peak appears within the another region corresponding to the binding energy range from 4.5 eV to 5.4 eV.

13. The organic EL element according to claim 10, wherein the part of the bank reaches a bottom of the recess of the hole injection layer, and a side surface of the bank slopes upward from the bottom of the recess to a top of the bank.

14. The organic EL element according to claim 10, wherein the part of the bank is out of contact with a bottom of the recess.

15. The organic EL element according to claim 10, wherein the hole injection layer extends laterally along a bottom surface of the bank.

16. The organic EL element according to claim 10, wherein the upper peripheral edge of the recess is a convex portion composed of (i) a part of the upper surface of the hole injection layer in which the recess is not formed and (ii) the inner side surface of the recess.

17. A display apparatus comprising the organic EL element according to claim 1.

18. A light-emitting apparatus comprising the organic EL element according to claim 1.

19. The organic EL element according to claim 1, wherein a film thickness of a portion of the light-emitting layer above a lower surface that is in contact with the hole injection layer is uniform.

20. The organic EL element according to claim 10, wherein a film thickness of a portion of the light-emitting layer above a lower surface that is in contact with the hole injection layer is uniform.

\* \* \* \* \*